US008822997B2

(12) United States Patent
Yamazaki

(10) Patent No.: US 8,822,997 B2
(45) Date of Patent: Sep. 2, 2014

(54) ELECTROPHORETIC DISPLAY DEVICE AND METHOD FOR MANUFACTURING THEREOF

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 438 days.

(21) Appl. No.: 12/212,983

(22) Filed: Sep. 18, 2008

(65) Prior Publication Data

US 2009/0078938 A1   Mar. 26, 2009

(30) Foreign Application Priority Data

Sep. 21, 2007   (JP) .................................. 2007-246100

(51) Int. Cl.
| | |
|---|---|
| *H01L 29/10* | (2006.01) |
| *H01L 29/04* | (2006.01) |
| *H01L 31/00* | (2006.01) |

(52) U.S. Cl.
USPC .................................... 257/59; 257/E29.294

(58) Field of Classification Search
USPC ...................... 257/E29.003, 43, 57, E21.414, 257/E29.291, E29.294, 59, 66; 345/107, 345/100; 438/158
See application file for complete search history.

(56) References Cited

U.S. PATENT DOCUMENTS

| | | | |
|---|---|---|---|
| 4,409,134 A | 10/1983 | Yamazaki | |
| 5,311,040 A | 5/1994 | Hiramatsu et al. | |
| 5,453,858 A | 9/1995 | Yamazaki | |
| 5,648,662 A | 7/1997 | Zhang et al. | |
| 5,701,167 A | 12/1997 | Yamazaki | |
| 5,766,989 A | 6/1998 | Maegawa et al. | |
| 5,811,328 A | 9/1998 | Zhang et al. | |
| 5,834,345 A | 11/1998 | Shimizu | |

(Continued)

FOREIGN PATENT DOCUMENTS

| | | |
|---|---|---|
| EP | 0449539 A | 10/1991 |
| EP | 0 473 988 | 3/1992 |

(Continued)

OTHER PUBLICATIONS

"JP 11016835 A JPO translation".*

(Continued)

*Primary Examiner* — Daniel Luke
*Assistant Examiner* — Latanya N Crawford
(74) *Attorney, Agent, or Firm* — Eric J. Robinson; Robinson Intellectual Property Law Office, P.C.

(57) ABSTRACT

It is an object to provide an electrophoretic display device having a thin film transistor which has highly reliable electric characteristics, lightweight, and flexibility. A gate insulating film is formed over a gate electrode, a microcrystalline semiconductor film which functions as a channel formation region is formed over the gate insulating film, a buffer layer is formed over the microcrystalline semiconductor film, a pair of source and drain regions are formed over the buffer layer, a pair of the source and drain electrodes in contact with the source and drain regions are formed. Then, the inverted-staggered thin film transistor is interposed between the flexible substrates, and the thin film transistor is provided with electrophoretic display element which is electrically connected by the pixel electrode. Then, the electrophoretic display electrode is surrounded by the partition layer so as to cover the end portion of the pixel electrode and provided over the pixel electrode.

13 Claims, 10 Drawing Sheets

(56) References Cited

U.S. PATENT DOCUMENTS

| | | | |
|---|---|---|---|
| 5,849,601 A | 12/1998 | Yamazaki | |
| 6,023,075 A | 2/2000 | Yamazaki | |
| 6,124,155 A | 9/2000 | Zhang et al. | |
| 6,166,399 A | 12/2000 | Zhang et al. | |
| 6,252,249 B1 | 6/2001 | Yamazaki | |
| 6,306,213 B1 | 10/2001 | Yamazaki | |
| 6,335,213 B1 | 1/2002 | Zhang et al. | |
| 6,750,087 B2 | 6/2004 | Morita et al. | |
| 6,756,258 B2 | 6/2004 | Zhang et al. | |
| 6,762,802 B2 * | 7/2004 | Ono et al. | 349/38 |
| 6,797,548 B2 | 9/2004 | Zhang et al. | |
| 6,838,696 B2 | 1/2005 | Kobayashi et al. | |
| 6,847,064 B2 | 1/2005 | Zhang et al. | |
| 6,885,146 B2 | 4/2005 | Yamazaki et al. | |
| 7,067,844 B2 | 6/2006 | Yamazaki | |
| 7,084,017 B2 | 8/2006 | Nakamura et al. | |
| 7,098,479 B1 | 8/2006 | Yamazaki | |
| 7,115,902 B1 | 10/2006 | Yamazaki | |
| 7,394,097 B2 | 7/2008 | Kobayashi et al. | |
| 7,645,648 B2 | 1/2010 | Kobayashi et al. | |
| 7,755,088 B2 | 7/2010 | Kobayashi et al. | |
| 8,174,013 B2 * | 5/2012 | Moriguchi et al. | 257/59 |
| 2001/0040648 A1 * | 11/2001 | Ono et al. | 349/43 |
| 2003/0036277 A1 * | 2/2003 | Cha et al. | 438/694 |
| 2003/0173890 A1 * | 9/2003 | Yamazaki et al. | 313/498 |
| 2004/0188685 A1 | 9/2004 | Lin et al. | |
| 2005/0017243 A1 | 1/2005 | Zhang et al. | |
| 2005/0139824 A1 * | 6/2005 | Park | 257/40 |
| 2005/0179036 A1 * | 8/2005 | Yamazaki et al. | 257/66 |
| 2005/0248828 A1 * | 11/2005 | Katase | 359/296 |
| 2006/0019433 A1 * | 1/2006 | Chen | 438/151 |
| 2006/0027804 A1 * | 2/2006 | Yamazaki et al. | 257/59 |
| 2007/0018165 A1 | 1/2007 | Yamazaki | |
| 2007/0297039 A1 * | 12/2007 | Lee et al. | 359/296 |
| 2008/0001155 A1 * | 1/2008 | Jung et al. | 257/59 |
| 2008/0036730 A1 * | 2/2008 | Ikeda et al. | 345/107 |
| 2008/0044962 A1 | 2/2008 | Zhang et al. | |
| 2008/0180385 A1 * | 7/2008 | Yoshida et al. | 345/102 |
| 2009/0001375 A1 | 1/2009 | Yamazaki et al. | |
| 2009/0002591 A1 * | 1/2009 | Yamazaki et al. | 349/43 |
| 2009/0039349 A1 * | 2/2009 | Honda | 257/59 |
| 2009/0061721 A1 * | 3/2009 | Isa | 445/24 |
| 2009/0309100 A1 * | 12/2009 | Moriguchi et al. | 257/59 |
| 2010/0096631 A1 * | 4/2010 | Miyairi et al. | 257/57 |

FOREIGN PATENT DOCUMENTS

| | | | |
|---|---|---|---|
| JP | 60-098680 | | 6/1985 |
| JP | 61-087371 | | 5/1986 |
| JP | 03-278466 A | | 12/1991 |
| JP | 04-242724 | | 8/1992 |
| JP | 06-045354 | | 2/1994 |
| JP | 06-342909 A | | 12/1994 |
| JP | 08-195492 | | 7/1996 |
| JP | 09-092841 A | | 4/1997 |
| JP | 11016835 A * | | 1/1999 |
| JP | 11-121761 | | 4/1999 |
| JP | 11121761 A * | | 4/1999 |
| JP | 2001-339072 A | | 12/2001 |
| JP | 2002-246605 | | 8/2002 |
| JP | 2003-297850 A | | 10/2003 |
| JP | 2003-337353 | | 11/2003 |
| JP | 2004-304140 A | | 10/2004 |
| JP | 2005-049832 | | 2/2005 |
| JP | 2005-167051 | | 6/2005 |
| JP | 2005167051 A * | | 6/2005 |
| JP | 2006-251093 | | 9/2006 |
| JP | 2007-005508 | | 1/2007 |
| JP | 2007-035964 | | 2/2007 |
| JP | 2007035964 A * | | 2/2007 |
| JP | WO2008/029582 * | | 3/2008 ............ H01L 29/786 |
| JP | 2009-044133 A | | 2/2009 |

OTHER PUBLICATIONS

"JP 2007035964 A machine translation".*
"JP 11121761 A machine translation".*
"JP 2005167051 A machine translation".*
Arai et al., "41.2: Micro Silicon Technology for Active Matrix OLED Display," SID Digest '07: SID International Symposium Digest of Technical Papers, 2007, pp. 1370-1373.
Lee et al., "High-Mobility Nanocrystalline Silicon Thin-Film Transistors Fabricated by Plasma-Enhanced Chemical Vapor Deposition," Applied Physics Letters, May 24, 2005, vol. 86, pp. 222106-1-222106-3.
Lee et al., "High-Mobility N-Channel and P-Channel Nanocrystalline Silicon Thin-Film Transistors," IEDM 05: Technical Digest of International Electron Devices Meeting, 2005, pp. 937-940.
Lee et al., "Directly Deposited Nanocrystalline Silicon Thin-Film Transistors with Ultra High Mobilities," Applied Physics Letters, Dec. 18, 2006, vol. 89, pp. 252101-1-252101-3.
Lee et al., "How to Achieve High Mobility Thin Film Transistors by Direct Deposition of Silicon Using 13.56 MHz RF PECVD?" IEEE IEDM, 2006, pp. 295-298.
Esmaeili-Rad et al., "High Stability, Low Leakage Nanocrystalline Silicon Bottom Gate Thin Film Transistors for AMOLED Displays," IEEE IEDM, 2006, pp. 303-306.
Lee et al., "Leakage Current Mechanisms in Top-Gate Nanocrystalline Silicon Thin Film Transistors," Applied Physics Letters, 2008, vol. 92, pp. 083509-1-083509-3.
Esmaeili-Rad et al., "Absence of Defect State Creation in Nanocrystalline Silicon Thin Film Transistors Deduced from Constant Current Stress Measurements," Applied Physics Letters, 2007, vol. 91, pp. 113511-1-113511-3.
Lee et al., "Stability of nc-Si:H TFTs with Silicon Nitride Gate Dielectric," IEEE Transactions on Electron Devices, Jan. 2007, vol. 54, No. 1, pp. 45-51.
Sazonov et al., "Low-Temperature Materials and Thin Film Transistors for Flexible Electronics," Proceedings of the IEEE, Aug. 2005, vol. 93, No. 8, pp. 1420-1428.
Esmaeili-Rad et al., "Stability of Nanocrystalline Silicon Bottom-Gate Thin Film Transistors with Silicon Nitride Gate Dielectric," Journal of Applied Physics, 2007, vol. 102, pp. 064512-1-064512-7.
Lee et al., "Top-Gate TFTs Using 13.56MHz PECVD Microcrystalline Silicon," IEEE Electron Device Letters, vol. 26, No. 9, Sep. 2005, pp. 637-639.
Lee et al., "Postdeposition Thermal Annealing and Material Stability of 75° C. Hydrogenated Nanocrystalline Silicon Plasma-Enhanced Chemical Vapor Deposition Films," Journal of Applied Physics, 2005, vol. 98, pp. 034305-1-034305-7.
Arai et al., "41.2: Micro Silicon Technology for Active Matrix OLED Display," SID Digest '07: SID International Symposium Digest of Technical Papers, 2007, vol. 38, pp. 1370-1373.

* cited by examiner

ELECTROPHORETIC DISPLAY DEVICE AND METHOD FOR MANUFACTURING THEREOF

BACKGROUND OF THE INVENTION

1. Field of the Invention

The present invention relates to a display device and a method for manufacturing the display device provided with an electrophoretic display element for displaying images in such a manner that fine particles dispersed in a solvent is made to move or rotate according to voltage application to an interposed electrode so that the reflectivity is changed. The present invention relates to, in particular, an electrophoretic display device and the method for manufacturing the electrophoretic display device which is formed by combining an electrophoretic display element and a thin film transistor (hereinafter, referred to as a TFT) in which a channel region is formed using a microcrystalline semiconductor.

2. Description of the Related Art

In recent years, electronic paper (also referred to as digital paper or a paper like display) is attracted attention and some of it is put into practical use. The form that the electronic paper finally aims is as follows: the form which is thin, has high visibility, is rewritable, and holds display even after power is turned off.

In a technique of the electronic paper, a method in which an image is displayed using a phenomenon promoting movement and rotation of particles by an electric field is referred to as an electrophoretic method. The electronic paper in the electrophoretic method (hereinafter, referred to as an electrophoretic display device) is disclosed in patent document 1 (Japanese Published Patent Application No. 2006-251093). According to patent document 1, a thin film transistor (TFT) is used as a switching element for controlling the voltage between electrodes in each pixel. As a switching element, a thin film transistor using an amorphous semiconductor film (amorphous silicon or the like), a thin film transistor using a polycrystalline semiconductor film (low temperature polysilicon or the like), or the like is used. Note that as a method for forming a polycrystalline semiconductor film, there is a known technique in which a pulsed excimer laser beam is shaped into a linear laser beam by an optical system and an amorphous silicon film is crystallized by being irradiated while being scanned with the linear laser beam.

As described in patent document 1, a thin film transistor using a polycrystalline semiconductor film has advantages that mobility is higher than that of a thin film transistor using an amorphous semiconductor film by two or more digits, and a pixel portion and a peripheral driver circuit of an electrophoretic display device can be formed over one substrate. However, the thin film transistor using a polycrystalline semiconductor film requires a more complicated process than the thin film transistor using an amorphous semiconductor film because of crystallization of the semiconductor film. Thus, there are problems such as a reduction in yield and an increase in cost.

SUMMARY OF THE INVENTION

An electrophoretic display device which is one of the electronic paper techniques is needed to be manufactured as a large-sized display medium which can be folded like paper of a magazine and a newspaper, in order that the electrophoretic display device is used instead of a paper based information medium. Therefore, in a structure where a thin film transistor using an organic semiconductor layer or the like is provided over a flexible substrate, although a large-sized display medium which can be folded can be manufactured, there is still room for improving electric characteristics such as mobility or the like in order to obtain an excellent display of a moving image or the like.

In view of the above-described problem, it is an object of the present invention to provide a flexible electrophoretic display device which has high electric characteristics and a highly reliable thin film transistor, and is lightweight.

In the electrophoretic display device having an inverted-staggered thin film transistor, the inverted staggered thin film transistor is formed as follows: a gate insulating film is formed over a gate electrode; a microcrystalline semiconductor film (also referred to as a semi-amorphous semiconductor film) which functions as a channel formation region is formed over the gate insulating film; a buffer layer is formed over the microcrystalline semiconductor film; a pair of source and drain regions are formed over the buffer layer; and a pair of source and drain electrodes are formed in contact with the source and drain regions. The inverted-staggered thin film transistor is interposed between flexible substrates, and the thin film transistor is provided with an electrophoretic display element which is electrically connected by a pixel electrode. An electrophoretic display element is surrounded by a partition layer provided so as to cover an end portion of a pixel electrode and provided over the pixel electrode.

Further, end portions of the source and drain electrodes are not aligned with end portions of the source and drain regions, and the end portions of the source and drain regions are formed outside the end portions of the source and drain electrodes. Due to misalignment of the end portions of the source and drain electrodes with the end portions of the source and drain regions, and due to formation of the end portions of the source and drain regions outside the end portions of the source and drain electrodes, the end portions of the source and drain electrodes are apart from each other; accordingly, leakage current and short circuit between the source and drain electrodes can be prevented. In addition, an electric field can be prevented from being concentrated on the end portions of the source and drain electrodes and the source and drain regions, and leakage current between the gate electrode and each of the source and drain electrodes can be prevented.

Moreover, the buffer layer has a depression in its part, and the sides of the depression are aligned with the end portions of the source and drain regions. The buffer layer has a depression in its part and has a distance, so that leakage current between the source and drain regions can be reduced.

The buffer layer is formed between the microcrystalline semiconductor film and the source and drain regions. The microcrystalline semiconductor film functions as a channel formation region. The buffer layer functions as a high-resistance region as well as preventing the microcrystalline semiconductor film from being oxidized. The buffer layer is formed between the microcrystalline semiconductor film and the source and drain regions, so that a thin film transistor having high mobility, low leakage current, and high withstand voltage can be formed.

As the buffer layer, an amorphous semiconductor film can be used, and moreover, it is preferable that the buffer layer comprises an amorphous semiconductor film containing any one or more of nitrogen, hydrogen, and halogen. Oxidation of a crystal grain included in a microcrystalline semiconductor film can be reduced by any one of nitrogen, hydrogen, and halogen which is included in an amorphous semiconductor film.

The buffer layer can be formed by a plasma CVD method, a sputtering method, or the like. Further, after an amorphous semiconductor film is formed, the surface of the amorphous semiconductor film can be nitrided, hydrogenated, or halogenated through processing of the surface of the amorphous semiconductor film with nitrogen plasma, hydrogen plasma, or halogen plasma.

By forming the buffer layer over the surface of the microcrystalline semiconductor film, oxidation of crystal grains contained in the microcrystalline semiconductor film can be reduced. Accordingly, the degree of degradation of electric characteristics of a thin film transistor can be lowered.

A microcrystalline semiconductor film can be directly formed as a microcrystalline semiconductor film over a substrate, which is different from a polycrystalline semiconductor film. Specifically, a microcrystalline semiconductor film can be formed using silicon hydride as a source gas and using a plasma CVD apparatus. The microcrystalline semiconductor film formed by the above method also includes a microcrystalline semiconductor film which has crystal grains with a diameter of 0.5 to 20 nm in an amorphous semiconductor. Thus, unlike the case of using a polycrystalline semiconductor film, there is no need to conduct a crystallization process after formation of a semiconductor film. The number of processes in manufacture of a thin film transistor can be reduced; yield of an electrophoretic display device can be increased; and cost can be lowered. In addition, silicon hydride, which is a source gas, can be easily dissociated because plasma generated by using microwaves with a frequency of 1 GHz or more has high electron density. Therefore, compared to a microwave plasma CVD method with a frequency of several tens to several hundreds of MHz, the microcrystalline semiconductor film can be formed more easily and deposition rate can be increased. Thus, the mass productivity of electrophoretic display devices can be increased.

In addition, thin film transistors (TFTs) are formed using a microcrystalline semiconductor film, and an electrophoretic display device is manufactured using the thin film transistors in a pixel portion and also in a driver circuit. The thin film transistor using a microcrystalline semiconductor film has a mobility of 1 to 20 $cm^2/V \cdot sec$, which is 2 to 20 times as high as that of a thin film transistor using an amorphous semiconductor film. Accordingly, part of a driver circuit or the entire driver circuit can be formed over the same substrate as a pixel portion, so that a system-on-panel can be manufactured.

An electrophoretic display device includes an electrophoretic display element. In addition, the electrophoretic display device includes a panel in which an electrophoretic display element is sealed to a substrate, and a module in which an IC and the like including a controller are mounted on the panel.

Note that the electrophoretic display device in this specification refers to a device which performs display using any of a display element in a microcapsule method, a vertical electrophoretic method, or a horizontal electrophoretic method. In addition, electrophoretic display devices include all of the following modules: modules provided with a connector, for example, a flexible printed circuit (FPC), a tape automated bonding (TAB) tape, or a tape carrier package (TCP); modules provided with a printed wiring board at the end of a TAB tape or a TCP; and modules where an integrated circuit (IC) is directly mounted on an electrophoretic display element by a chip-on-glass (COG) method.

According to the present invention, an electrophoretic display device, in which a thin film transistor having high electric characteristics and high reliability is included and is lightweight and flexible, and a manufacturing method thereof can be provided.

DETAILED DESCRIPTION OF THE INVENTION

Hereinafter, embodiment modes and an embodiment of the present invention will be described with reference to the accompanying drawings. However, the present invention may be embodied in a lot of different forms, and it is to be easily understood that various changes and modifications will be apparent to those skilled in the art unless such changes and modifications depart from the scope of the present invention. Therefore, the present invention is not to be construed with limitation to what is described in the embodiment modes.

(Embodiment Mode 1)

Figure 4:
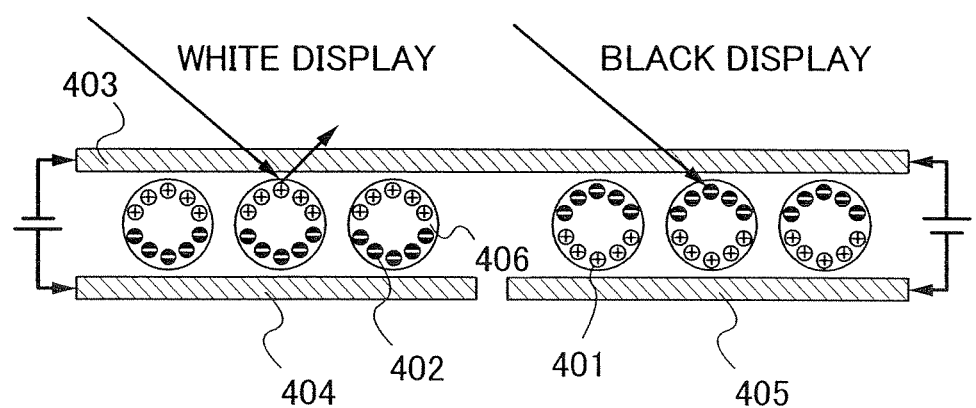
FIG. 4 is a view for illustrating an electrophoretic display device.
Figure 5A:
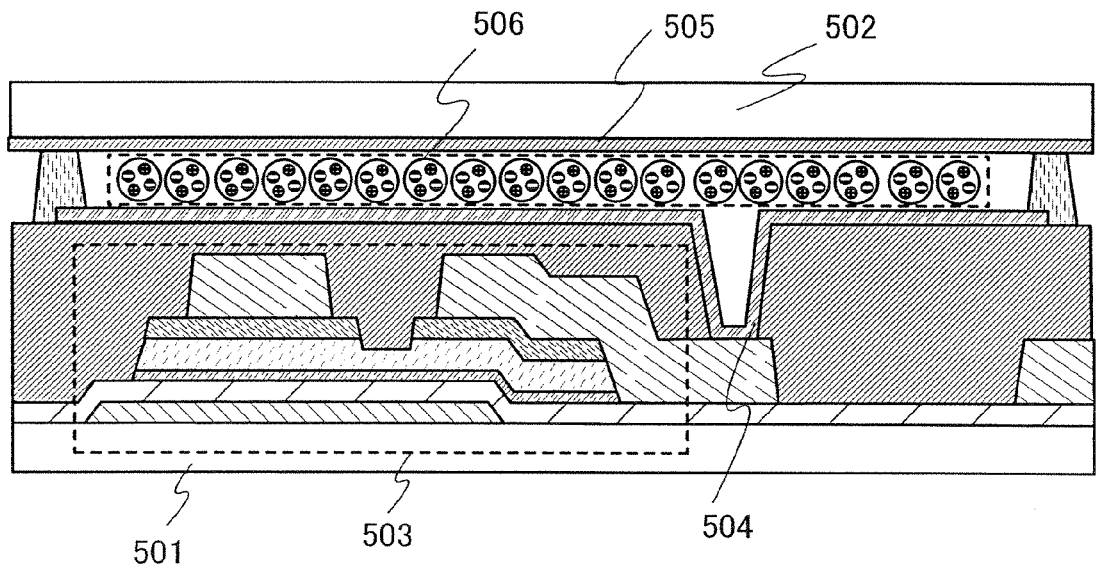
FIGS. 5A and 5B are respectively a top view and a longitudinal sectional view of a pixel included in an electrophoretic display device.
Figure 5B:
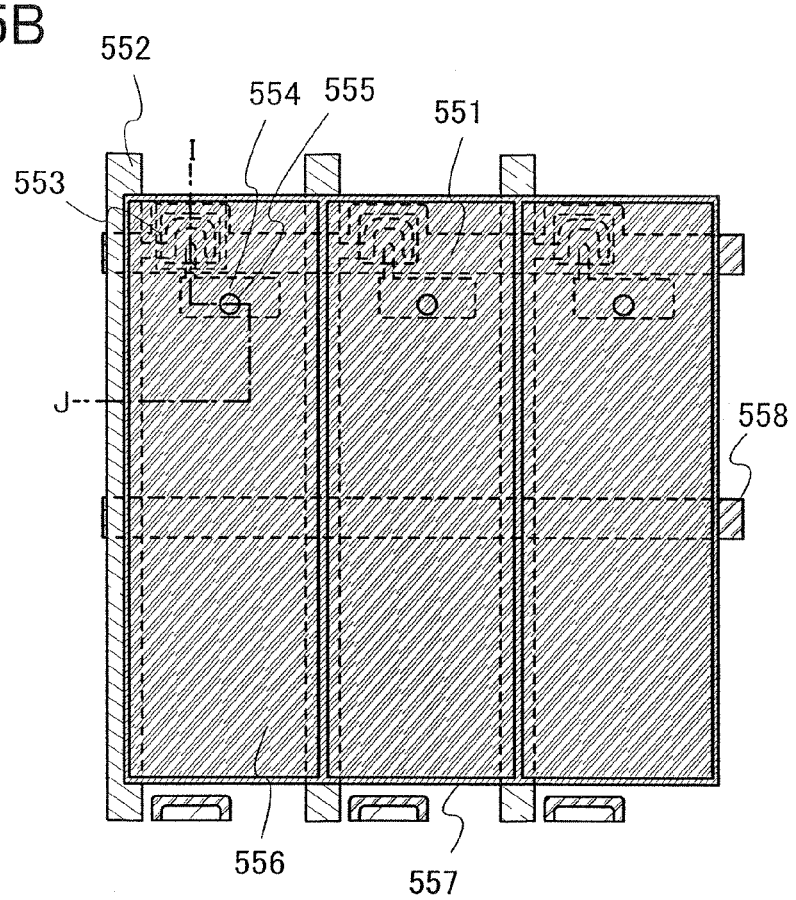
Figure 6A:
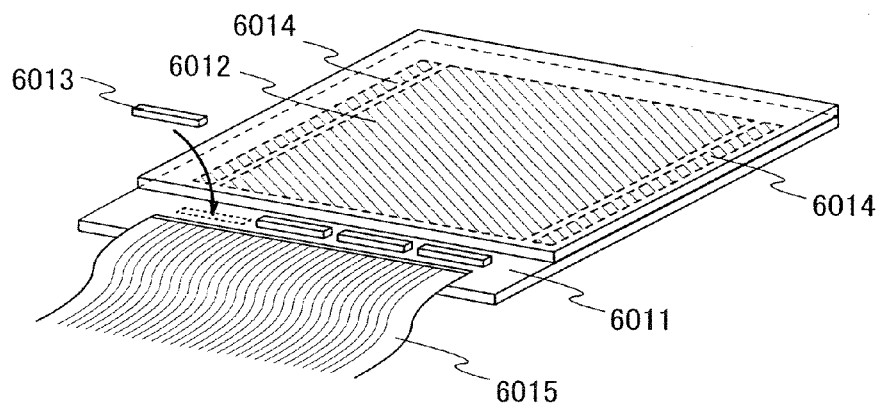
FIGS. 6A to 6C are views illustrating appearances of an electrophoretic display device.
Figure 6B:
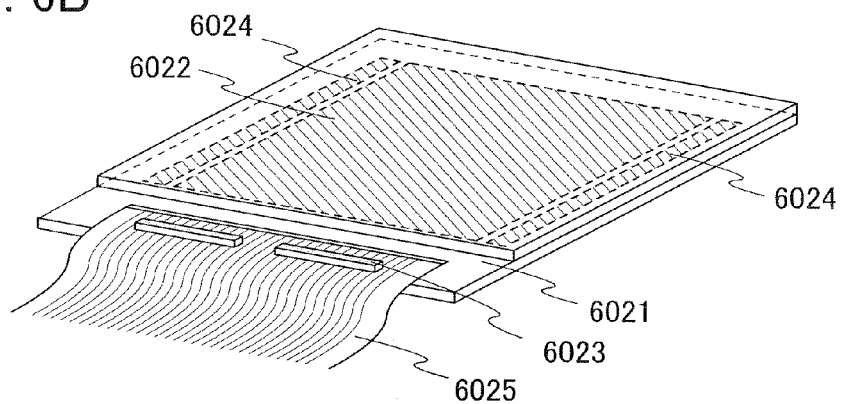
Figure 6C:
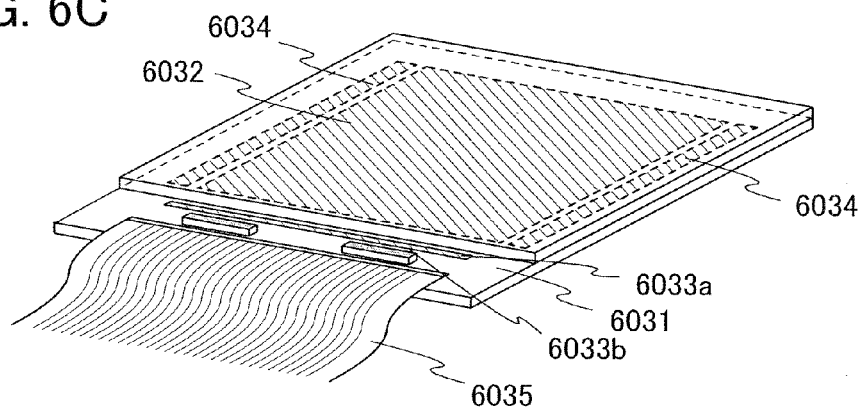

In this embodiment mode, a manufacturing process of an electrophoretic display device, in particular, a manufacturing process of a pixel having a thin film transistor are described with reference to FIGS. 1A to 1C, FIGS. 2A to 2C, FIGS. 3A and 3B, FIG. 4, FIGS. 5A and 5B, and FIGS. 6A to 6C. FIGS. 1A to 1C, FIGS. 2A to 2C, and FIGS. 3A and 3B are cross-sectional views illustrating a manufacturing process of a thin film transistor, FIG. 4 is a view for illustrating an electrophoretic display device, and FIGS. 5A and 5B are respectively a top view and a longitudinal sectional view of a connection region of a thin film transistor and a pixel electrode in a pixel. Further, FIGS. 6A to 6C illustrate appearances of an electrophoretic display device.

An n-channel thin film transistor having a microcrystalline semiconductor film is more suitable for use in a driver circuit than a p-channel thin film transistor having a microcrystalline semiconductor film because it has a higher mobility. It is desirable that all thin film transistors formed over one substrate have the same polarity, in order to reduce the number of processes. Here, description is made using an n-channel thin film transistor.

Figure 1A:
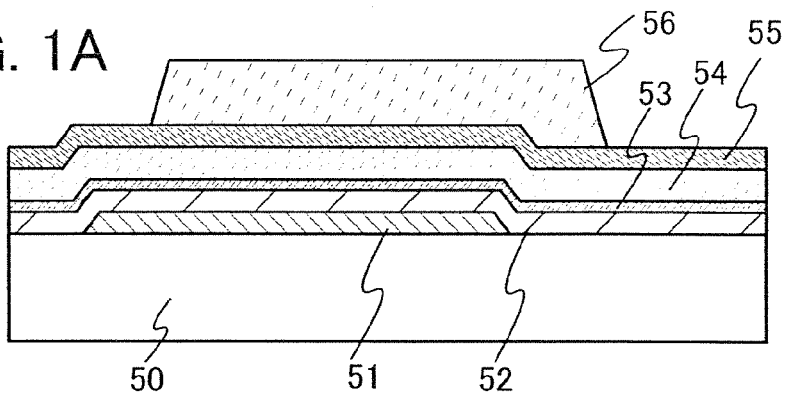
FIGS. 1A to 1C are cross-sectional views illustrating manufacturing process of an electrophoretic display device.

As illustrated in FIG. 1A, a gate electrode 51 is formed over a first flexible substrate 50. The first flexible substrate 50 is selected from polyethylene terephthalate (PET), polyethylene naphthalate (PEN), polyethersulfone (PES), polycarbonate (PC), polyimide, or the like, and the practical thickness of the first flexible substrate 50 is 10 to 200 μm. Of course, the structure of the present invention is not influenced even if the substrate is thicker than this. Note that it is preferable that a barrier layer be formed of an inorganic insulating material with a thickness of 10 to 200 nm over the surface of the first flexible substrate 50 and a second flexibility substrate. Note that the second flexible substrate corresponds to a counter substrate for interposing an electrophoretic display element with the first flexible substrate 50 and has at least light transmitting property. As a barrier layer, a single layer or a stacked structure using a plurality of layers which is formed of $AlO_xN_{1-x}$ (note that x=0.01 to 20 at. %) or silicon nitride which does not include hydrogen, and which is formed by a high frequency sputtering method using silicon as a target and using nitrogen as a sputtering gas, is employed. The inorganic insulating material is formed to be dense so as to be a barrier layer against steam and an organic gas which enters from the external environment. An object for forming the barrier layer is to prevent deterioration of an electrophoretic display element due to steam and the organic gas.

Note that terms of "first, second, third to N (N is natural number)" used in this specification is used just for preventing confusion of components, and do not limit to the amount of components.

The gate electrode 51 may be formed with a known metal material such as titanium, molybdenum, chromium, tantalum, tungsten, aluminum, or the like. It is preferable that the gate electrode 51 shaped in a predetermined shape using conductive paste including a metal material by a screen printing method or a roll coater method. After a predetermined pattern is formed with conductive paste and is dried, a thickness of 1 to 5 μm by curing at the temperature of 100 to 200° C. can be obtained.

Alternatively, the gate electrode 51 may be formed in the following manner: a conductive film is formed over the first flexible substrate 50, a mask is formed by an ink-jet method over the conductive film, and the conductive film is etched by using the mask. Alternatively, the gate electrode 51 may be formed by discharging a conductive nanopaste of silver, gold, copper, or the like by an ink-jet method and baking it.

Note that because a semiconductor film and a wiring are to be formed over the gate electrode 51, it is desired that the gate electrode 51 be processed so that its end portions are tapered in order to prevent disconnection. Further, although not illustrated, wirings connected to the gate electrode can also be formed at the same time when the gate electrode is formed.

Next, over the gate electrode 51, a gate insulating film 52, a microcrystalline semiconductor film 53, a buffer layer 54, and a semiconductor film 55 to which an impurity imparting one conductivity type is added, are sequentially formed. Then, a mask 56 is formed over the semiconductor film 55 to which an impurity imparting one conductivity type is added. Note that it is preferable that at least the gate insulating film 52, the microcrystalline semiconductor film 53, and the buffer layer 54 be formed successively. It is further preferable that the gate insulating film 52, the microcrystalline semiconductor film 53, the buffer layer 54, and the semiconductor film 55 to which an impurity imparting one conductivity type is added be formed successively. When at least the gate insulating film 52, the microcrystalline semiconductor film 53, and the buffer layer 54 are formed successively without being exposed to the air, the films can be formed without any contamination of interface between the films with air components or contaminant impurity elements contained in the air. Thus, variations in characteristics of thin film transistors can be reduced.

An Organic insulator material which is an organic solvent with acrylic resin, polyimide resin, polyamide resin, phenoxy resin, nonaromatic multifunctional isocyanate, melamine resin, or the like are added can be applied to the gate insulating film 52, and the gate insulating film 52 can be formed with a thickness 0.1 to 3 μm. Note that the gate insulating film 52 is not necessarily limited to an organic insulator material, and a silicon oxide film formed by an application method may be used. Alternatively, a silicon oxide film, a silicon nitride film, a silicon oxynitride film, or a silicon nitride oxide film may be formed by a CVD method, a sputtering method, or the like in a range of the temperature (200 to 300° C.) in which the flexible substrate can withstand.

Here, a silicon oxynitride film means a film that contains more oxygen than nitrogen and, in the case where measurements are performed using Rutherford backscattering spectrometry (RBS) and hydrogen forward scattering (HFS), includes oxygen, nitrogen, Si, and hydrogen at concentrations ranging from 55 to 70 at. %, 0.5 to 15 at. %, 25 to 35 at. %, and 0.1 to 10 at. %, respectively. Further, a silicon nitride oxide film means a film that contains more nitrogen than oxygen and includes oxygen, nitrogen, Si, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The microcrystalline semiconductor film 53 is a film which contains a semiconductor having an intermediate structure between amorphous and crystalline structures (including a single crystal and a polycrystal). This semiconductor has a third state which is stable in terms of free energy, and is a crystalline substance having short-range order and lattice distortion, which can be dispersed in an amorphous crystalline semiconductor with its grain size of 0.5 to 20 nm. Microcrystalline silicon, which is a typical example of a microcrystalline semiconductor, has a Raman spectrum which is shifted to a lower wavenumber side than 520.6 $cm^{-1}$ that represents single-crystal silicon. That is, the peak of a Raman spectrum of microcrystalline silicon is within the range from equal to or greater than 481 $cm^{-1}$ to equal to or less than 520.6 $cm^{-1}$. The microcrystalline semiconductor film includes hydrogen or halogen of at least 1 at. % or more to terminate a dangling bond. Moreover, a rare gas element such as helium, argon, krypton, or neon may be included to further promote lattice distortion, so that stability is enhanced and a favorable microcrystalline semiconductor film can be obtained. Such description about a microcrystalline semiconductor film is disclosed in, for example, U.S. Pat. No. 4,409,134.

This microcrystalline semiconductor film can be formed by a high frequency plasma CVD method at a frequency of several tens to several hundreds of MHz, or a microwave plasma CVD device at a frequency of equal to or greater than 1 GHz, at the formation temperature of approximately 150 to 300° C. Thus, the microcrystalline semiconductor film is a suitable semiconductor film for being formed over a flexible substrate having an upper temperature limit of approximately 200 to 300° C. The microcrystalline semiconductor film can be typically formed by diluting silicon hydride such as $SiH_4$ or $Si_2H_6$ with hydrogen. The microcrystalline semiconductor film can be formed by diluting with one or plural kinds of rare gas elements selected from helium, argon, krypton, or neon in addition to silicon hydride and hydrogen. In these cases, the flow ratio of hydrogen to silicon hydride is set to greater than or equal to 5 times and less than or equal to 200 times, preferably greater than or equal to 50 times and less than or equal to 150 times, further preferably 100 times. Note that, in place of silicon hydride, $SiH_2Cl_2$, $SiHCl_3$, $SiCl_4$, $SiF_4$, or the like can be used.

Further, the microcrystalline semiconductor film has low n-type conductivity when an impurity element for controlling valence electrons is not added thereto intentionally. Therefore, an impurity element imparting p-type conductivity may be added to the microcrystalline semiconductor film which functions as a channel formation region of a thin film transistor at the same time as or after formation of the microcrystalline semiconductor film, so that the threshold voltage can be controlled. A typical example of an impurity element which imparts p-type conductivity is boron, and an impurity gas such as $B_2H_6$ or $BF_3$ may be mixed into silicon hydride at a proportion of 1 to 1000 ppm, preferably, 1 to 100 ppm. The concentration of boron is preferably set at $1\times10^{14}$ to $6\times10^{16}$ atoms/cm$^3$.

In addition, the oxygen concentration of the microcrystalline semiconductor film is preferably $1\times10^{19}$ cm$^{-3}$ or less, more preferably, $5\times10^{18}$ cm$^{-3}$ or less, and each of the nitrogen concentration and the carbon concentration is preferably $5\times10^{18}$ cm$^{-3}$ or less, more preferably, $1\times10^{18}$ cm$^{-3}$ or less. Reducing concentrations of oxygen, nitrogen, and carbon which are mixed in the microcrystalline semiconductor film can prevent the microcrystalline semiconductor film from becoming an n-type.

The microcrystalline semiconductor film 53 is formed to have a thickness of greater than 0 nm and equal to or less than 200 nm, preferably, equal to or greater than 1 nm to equal to or less than 100 nm, more preferably, equal to or greater than 5 nm to equal to or less than 50 nm. The microcrystalline semiconductor film 53 functions as a channel formation region of a thin film transistor to be formed later. The thickness of the microcrystalline semiconductor film 53 is within the range from 5 to 50 nm, so that a thin film transistor to be formed later is to be a fully depleted type. In addition, because the deposition rate of the microcrystalline semiconductor film 53 is low, i.e., a tenth to a hundredth of the deposition rate of an amorphous semiconductor film, a decrease of thickness can lead to an increase of throughput. In addition, the microcrystalline semiconductor film is formed with microcrystalline, so that the microcrystalline semiconductor film has lower resistance than the amorphous semiconductor film. Therefore, a thin film transistor using the microcrystalline semiconductor film has current-voltage characteristics represented by a curve with a steep slope in a rising portion, has an excellent response as a switching element, and can be operated at high speed. With the use of the microcrystalline semiconductor film in a channel formation region of a thin film transistor, fluctuation of a threshold of a thin film transistor can be suppressed. Thus, an electrophoretic display device with little variation in electric characteristics can be manufactured.

Further, the microcrystalline semiconductor film has a higher mobility than an amorphous semiconductor film. In other words, a semiconductor film having high electric characteristics can be obtained without performing the crystallization treatment at a high temperature of approximately 600° C. like the case of the polycrystalline semiconductor film. Thus, the microcrystalline semiconductor film is suitable for the switching of an electrophoretic display element formed over the flexible substrate. By using a thin film transistor, a channel formation region of which is formed of the microcrystalline semiconductor film, the area of the channel formation region, that is, the area of the thin film transistor can be decreased.

The buffer layer 54 can be formed by a plasma CVD method using silicon hydride such as $SiH_4$ or $Si_2H_6$. Note that the buffer layer 54 can be formed at a deposition temperature of approximately 150 to 300° C. and is a suitable layer for being formed over the flexible substrate having an upper temperature limit of approximately 200 to 300° C., similar to the microcrystalline semiconductor film. Further, an amorphous semiconductor film can be formed by diluting above-mentioned silicon hydride with one or plural kinds of rare gas elements selected from helium, argon, krypton, or neon. With the use of hydrogen at a flow rate which is 1 to 20 times, preferably, 1 to 10 times, more preferably, 1 to 5 times as high as that of silicon hydride, a hydrogen-containing amorphous semiconductor film can be formed. Further, with the use of above-mentioned silicon hydride and nitrogen or ammonia, a nitrogen-containing amorphous semiconductor film can be formed. Furthermore, an amorphous semiconductor film including fluorine, chlorine, bromine, or iodine can also be formed using the above-mentioned silicon hydride, and a gas including fluorine, chlorine, bromine, or iodine (e.g., $F_2$, $Cl_2$, $Br_2$, $I_2$, HF, HCl, HBr, HI, or the like). Note that in place of silicon hydride, $SiH_2Cl_2$, $SiHCl_3$, $SiCl_4$, $SiF_4$, or the like can be used.

Alternatively, as the buffer layer 54, an amorphous semiconductor film can be formed by sputtering with hydrogen or a rare gas using an amorphous semiconductor as a target. At this time, if ammonia, nitrogen, or $N_2O$ is included in the atmosphere, an amorphous semiconductor film including nitrogen can be formed. Alternatively, an amorphous semiconductor film including fluorine, chlorine, bromine, or iodine can also be formed by including a gas including fluorine, chlorine, bromine, or iodine (e.g., $F_2$, $Cl_2$, $Br_2$, $I_2$, HF, HCl, HBr, HI, or the like) in atmosphere.

Still alternatively, the buffer layer 54 may be formed by formation of an amorphous semiconductor film over the surface of the microcrystalline semiconductor film 53 by a plasma CVD method or a sputtering method, and then, by hydrogenation, nitridation, or halogenation of the surface of the amorphous semiconductor film through processing of the surface of the amorphous semiconductor film with hydrogen plasma, nitrogen plasma, or halogen plasma. Alternatively, the surface of the amorphous semiconductor film may be processed with helium plasma, neon plasma, argon plasma, krypton plasma, or the like.

The buffer layer 54 is preferably formed using an amorphous semiconductor film which does not contain crystal grains. Therefore, if the buffer layer 54 is formed by a high-frequency plasma CVD method with a frequency of several tens of MHz to several hundreds of MHz, or a microwave plasma CVD method, it is preferable to control the film deposition conditions so that the buffer layer 54 may be an amorphous semiconductor film that does not include a crystal grain.

In some cases, the buffer layer 54 is partly etched in a later process of formation of source and drain regions, and at that time, the buffer layer 54 is preferably formed at such a thickness that the other parts of the buffer layer 54 are left after the etching. It is preferable that the buffer layer 54 is formed as such a thickness that part of remaining after the etching has a thickness of equal to or greater than 10 nm and equal to or less than 100 nm.

Note that it is preferable that an impurity imparting one conductivity type such as phosphorus or boron be not added to the buffer layer 54. In particular, it is preferable that boron contained in the microcrystalline semiconductor film for threshold control or phosphorus contained in the semiconductor film to which an impurity imparting one conductivity type is added be not mixed into the buffer layer 54. As a result of this, by elimination of a region where leakage current is generated due to a PN junction, leakage current can be decreased. By formation of an amorphous semiconductor film, to which an impurity imparting one conductivity type such as phosphorus or boron is not added, between the semiconductor film to which an impurity imparting one conductivity type is added and the microcrystalline semiconductor film, the diffusion of the impurity contained in each of the microcrystalline semiconductor film and source and drain regions can be prevented.

By formation of an amorphous semiconductor film, moreover, an amorphous semiconductor film including hydrogen, nitrogen, or halogen over the surface of the microcrystalline semiconductor film 53, surfaces of crystal grains contained in the microcrystalline semiconductor film 53 can be prevented from being oxidized naturally. In particular, in a region where an amorphous semiconductor is in contact with microcrystal grains, a crack is easily caused due to distortion of crystal lattice. If a crack is exposed to oxygen, the crystal grain is oxidized to form silicon oxide However, by formation of the buffer layer on the surface of the microcrystalline semiconductor film 53, the microcrystal grains can be prevented from being oxidized. Furthermore, by formation of the buffer layer, the microcrystalline semiconductor film can be prevented from being mixed with an etching residue which is generated in forming source and drain regions later.

Moreover, the buffer layer 54 is formed using an amorphous semiconductor film or is formed using an amorphous semiconductor film containing hydrogen, nitrogen or halogen. Therefore, an energy gap of the amorphous semiconductor film is larger than that of a microcrystalline semiconductor film (the energy gap of the amorphous semiconductor film is equal to or greater than 1.6 eV and equal to or less than 1.8 eV, and the energy gap of the microcrystalline semiconductor film is equal to or greater than 1.1 eV and equal to or less than 1.5 eV). The buffer layer 54 has high resistance, and low mobility which is one fifth to one tenth of that of the microcrystalline semiconductor film. Therefore, in a thin film transistor to be formed later, the buffer layer formed between source and drain regions, and the microcrystalline semiconductor film functions as a high-resistance region and the microcrystalline semiconductor film functions as a channel formation region. Thus, the off current of the thin film transistor can be reduced. When the thin film transistor is used as a switching element of an electrophoretic display device, the contrast of the electrophoretic display device can be improved.

In the case where an n-channel thin film transistor is formed, phosphorus may be added as a typical impurity element to the semiconductor film 55 to which an impurity imparting one conductivity type is added, and an impurity gas such as $PH_3$ may be added to silicon hydride. In the case where a p-channel thin film transistor is formed, boron may be added as a typical impurity element, and an impurity gas such as $B_2H_6$ may be added to silicon hydride. The semiconductor film 55 to which an impurity imparting one conductivity type is added can be formed of a microcrystalline semiconductor or an amorphous semiconductor. The semiconductor film 55 to which an impurity imparting one conductivity type is added is formed to have a thickness of equal to or greater than 2 nm and equal to or less than 50 nm. The thickness of the semiconductor film to which an impurity imparting one conductivity type is added is decreased, whereby throughput can be improved. Note that the semiconductor film 55 becomes a region functioning as source and drain regions in a thin film transistor later.

The mask 56 is formed by a photolithography technique or an inkjet method.

Figure 1B:
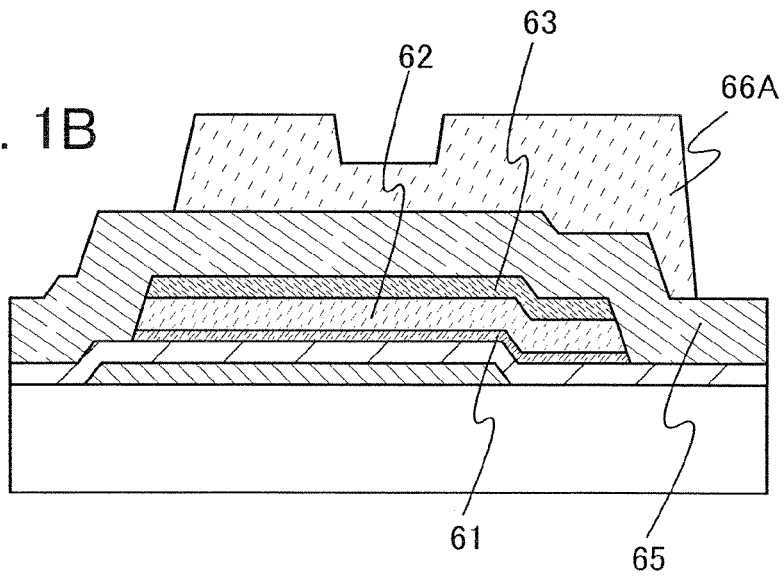

Next, the microcrystalline semiconductor film 53, the buffer layer 54, and the semiconductor film 55 to which an impurity imparting a conductivity type is added are divided by etching using the mask to form a microcrystalline semiconductor film 61, a buffer layer 62, and a semiconductor film 63 to which an impurity imparting a conductivity type is added, as shown in FIG. 1B. After that, the mask 56 is removed.

Next, as shown in FIG. 1B, a conductive film is formed over the semiconductor film 63 to which an impurity imparting a conductivity type is added and the gate insulating film 52b, and a mask 66A is formed over the conductive film.

It is preferable that the conductive film be formed using a single layer or stacked layers of aluminum, copper, or an aluminum alloy to which an element to improve heat resistance such as silicon, titanium, neodymium, scandium, or molybdenum or an element to prevent a hillock is added. Alternatively, a film in contact with the semiconductor film to which an impurity element imparting one conductivity type is added may be formed of titanium, tantalum, molybdenum, or tungsten, or nitride of such an element, and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or nitride thereof to form a stacked-layer structure.

A conductive film 65 is formed by a sputtering method or a vacuum evaporation method. Alternatively, the conductive film 65 may be formed with a known metal material such as titanium, molybdenum, chromium, tantalum, tungsten, aluminum, or the like. The conductive film 65 may be formed by a screen printing method, or a roll coater method using a conductive paste including a metal material Further alternatively, the conductive film 65 may be formed by discharging a conductive paste to have a desired shape by an inkjet method or the like and baking it.

The mask 66A can be formed by a photolithography technique using a multi-tone mask such as a gray tone mask or a half tone mask.

Figure 1C:
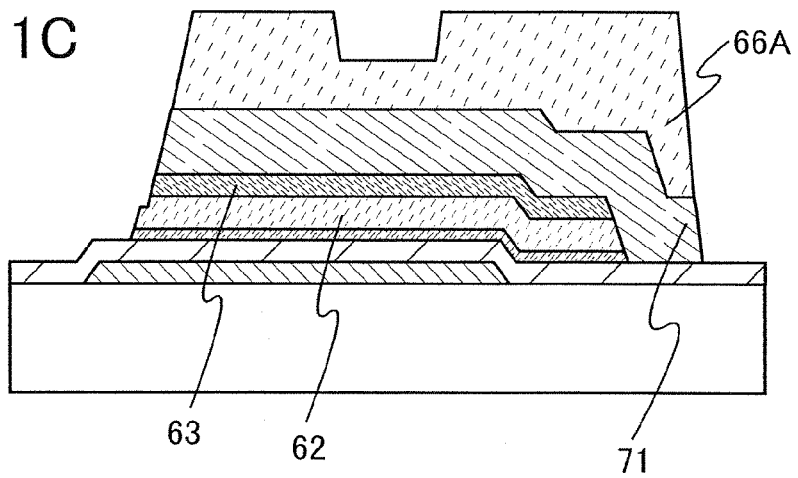

Next, the conductive film 65 is divided by etching using the mask 66A to form a conductive film 71 as shown in FIG. 1C.

Figure 2A:
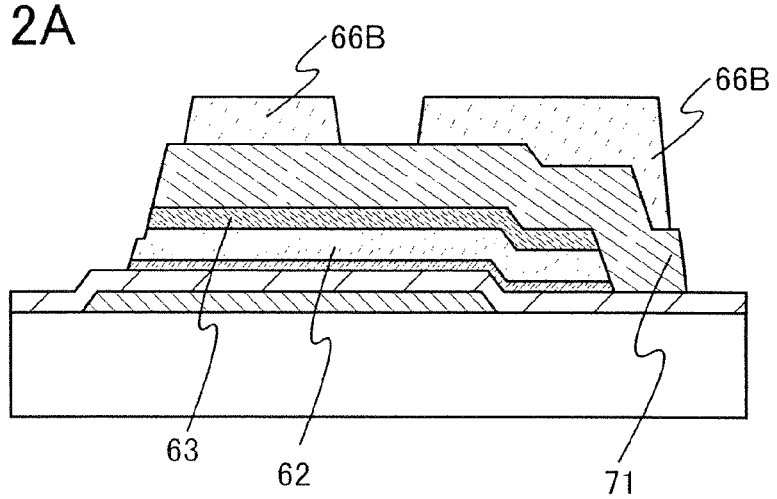
FIGS. 2A to 2C are cross-sectional views illustrating manufacturing process of an electrophoretic display device.

Next, ashing is performed on the mask 66A. As the result, the area and the thickness of the mask 66A which is formed by a resist is reduced. At this time, a region of the mask 66A where the thickness is thin (a region overlapping with a part of the gate electrode 51) is removed, and, as shown in FIG. 2A, resist masks 66B which are separated can be formed.

Figure 2B:
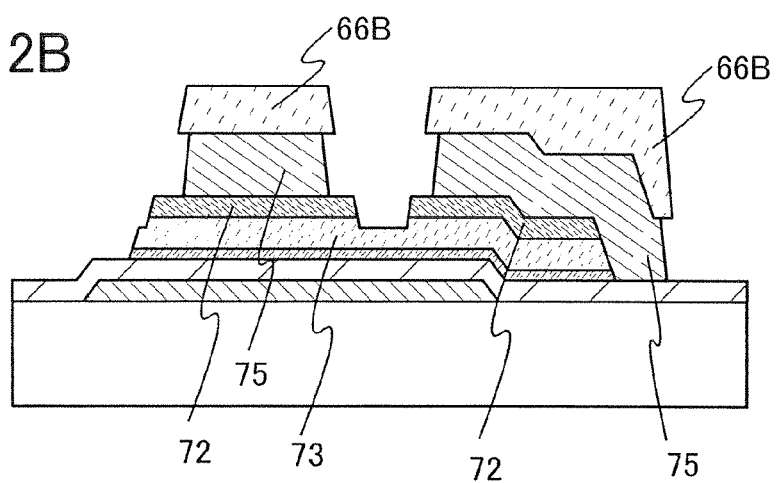

Next, as shown in FIG. 2B, the conductive film 71 is partly etched to form source and drain electrodes 75 using the masks 66B. Here, when the conductive film 71 is wet-etched using the masks 66B, the end portions of the conductive film 71 are etched selectively. Subsequently, as shown in FIG. 2B, the semiconductor film 63 to which an impurity imparting a conductivity type is added and the buffer layer 62 are etched using the masks 66B to form source and drain regions 72 and a buffer layer 73. Here, when the semiconductor film 63 to which an impurity imparting a conductivity type is added and the buffer layer 62 are anisotropically etched by dry etching, the source and drain regions 72 which have an area the same as or substantially the same as the masks 66B can be formed. Note that the buffer layer 73 is etched only partly and covers the surface of the microcrystalline semiconductor film 61.

As a result, the source and drain electrodes 75 having smaller areas than the conductive film 71 can be formed. The end portions of the source and drain electrodes 75 are not aligned with the end portions of the source and drain regions 72, and most of the end portions of the source and drain regions 72 are formed outside the end portions of the source and drain electrodes 75. In other words, one portion of each top surface of the source and drain regions 72 is partly in contact with the source and drain electrodes 75, the other portions of the each top surface of the source and drain regions are not in contact with the source and drain electrodes.

After that, the masks 66B are removed. One of the source and drain electrodes also functions as a source wiring or a drain wiring.

As shown in FIG. 2B, the end portions of the source and drain electrodes 75 are not aligned with the end portions of the source and drain regions 72, and the end portions are apart from each other; whereby the distance between the end portions of the source and drain electrodes 75 can be increased; thus, leakage current or short circuit between the source and drain electrodes can be prevented. In addition, because of the structure where the end portions of the source and drain electrodes 75 are not aligned with the end portions of the source and drain regions 72 and the end portions are apart from each other, an electric field can be prevented from being concentrated on the end portions of the source and drain electrodes 75 and the source and drain regions 72, and leakage current between the gate electrode 51 and the source and drain electrodes 75 can be prevented. Thus, a thin film transistor with high reliability and high withstand voltage can be manufactured.

Through the above-described process, a channel-etch thin film transistor 74 can be formed.

In the thin film transistor described in this embodiment mode, the gate insulating film, the microcrystalline semiconductor film, the buffer layer, the source and drain regions, and the source and drain electrodes are stacked over the gate electrode, and the buffer layer covers the surface of the microcrystalline semiconductor film which functions as a channel formation region. In addition, a depression (a groove) is formed in a part of the buffer layer, and regions other than the depression are covered with the source and drain regions. That is, due to the depression formed in the buffer layer, the source and drain regions are apart from each other; thus, leakage current between the source and drain regions can be reduced. In addition, because the depression is formed by partly etching the buffer layer, an etching residue which is generated in the formation process of the source and drain regions can be removed. Accordingly, leakage current (parasitic channel) can be prevented from being generated between the source and drain regions through the residue.

The buffer layer is formed between the microcrystalline semiconductor film which functions as a channel formation region, and the source and drain regions. In addition, the surface of the microcrystalline semiconductor film is covered by the buffer layer. Since the buffer layer, which is formed to have high resistance, is extended to regions between the microcrystalline semiconductor film and the source and drain regions, leakage current generated in the thin film transistor can be reduced, and deterioration due to application of high voltage can be suppressed. Moreover, since the amorphous semiconductor film, the surface of which is terminated with hydrogen, is formed as the buffer layer on the surface of the microcrystalline semiconductor film, the microcrystalline semiconductor film can be prevented from being oxidized, and an etching residue which is generated in the formation process of the source and drain regions can be prevented from being mixed into the microcrystalline semiconductor film. Thus, the thin film transistor has high electric characteristics and excellent withstand voltage.

Since the end portions of the source and drain electrodes are apart from each other due to the shape where the end portions of the source and drain electrodes are not aligned with the end portions of the source and drain regions, leakage current and short circuit between the source and drain electrodes can be prevented.

Above-mentioned FIGS. 2A and 2B described an example in which, after the buffer layer 73 having a depression (a groove) in its part is formed, etching is performed to increase the distance between the end portions of the source and drain electrodes; however, the present invention is not particularly limited thereto. For example, after the conductive film 65 is divided by etching, and the semiconductor film 63 to which an impurity imparting a conductivity type is added is exposed, etching is performed in order to increase the distance between the end portions of source and drain electrodes Subsequently, processes in which the semiconductor film 63 is etched to divide the source and drain regions 72 using the masks 66B, and then a depression (a groove) is formed in a part of the buffer layer 73 may be employed.

Figure 2C:
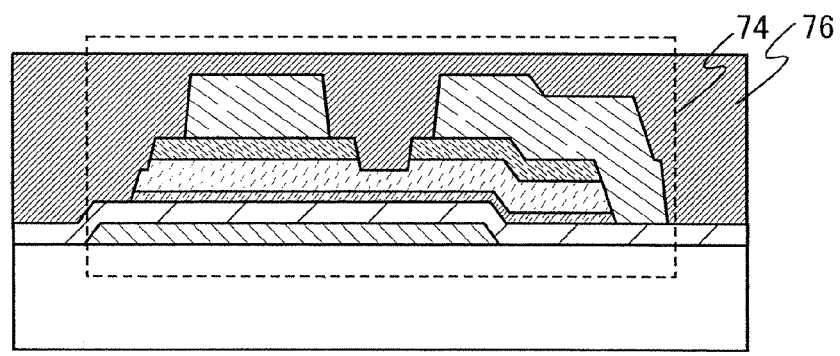

Next, as shown in FIG. 2C, an interlayer insulating layer 76 is formed over the source and drain electrodes 75, the source and drain regions 72, the buffer layer 73, and the gate insulating film 52. The interlayer insulating layer 76 can be formed in a manner similar to the gate insulating film 52. For example, an organic insulator material which is an organic solvent with acrylic resin, polyimide resin, polyamide resin, phenoxy resin, nonaromatic multifunctional isocyanate, melamine resin, or the like added are employed, and after it is dried, the interlayer insulating layer 76 is cured at the temperature of 100 to 200° C. to have a thickness of 1 to 5 μm. Moreover, the material of the interlayer insulating layer 76 is not necessarily limited to the organic insulator material, and a silicon oxide film formed by an application method may be used. A silicon oxide film, a silicon nitride film, a silicon oxynitride film, or a silicon nitride oxide film can be formed by a CVD method, a sputtering method, or the like in a range of the temperature that the flexible substrate can withstand (200 to 300° C.). Note that when unevenness is formed over the surface of the interlayer insulating layer 76, it is preferable to perform planarization for the surface because excellent coverage can be obtained in forming a pixel electrode on the surface. Note that as the planarization treatment, an etched back method in which etching for planarization is performed after the insulating film is formed, mechanical chemical polishing (CMP method), or the like can be used.

Figure 3A:
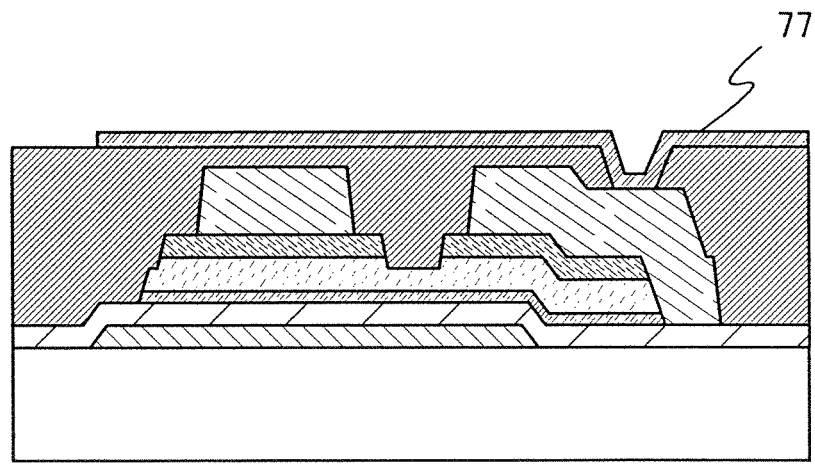
FIGS. 3A and 3B are cross-sectional views illustrating manufacturing process of an electrophoretic display device.

Next as shown in FIG. 3A, a contact hole is formed in the interlayer insulating layer 76. Note that the contact hole may be formed in advance in such manner that the interlayer insulating layer 76 is formed to have a contact hole by a screen printing method. A pixel electrode 77 in contact with the source or drain electrode in the contact hole is formed. The pixel electrode 77 does not necessarily have light transmitting property, and is formed with a conductive carbon paste, a conductive silver paste, a conductive copper paste, a conductive nickel, or the like.

Figure 3B:
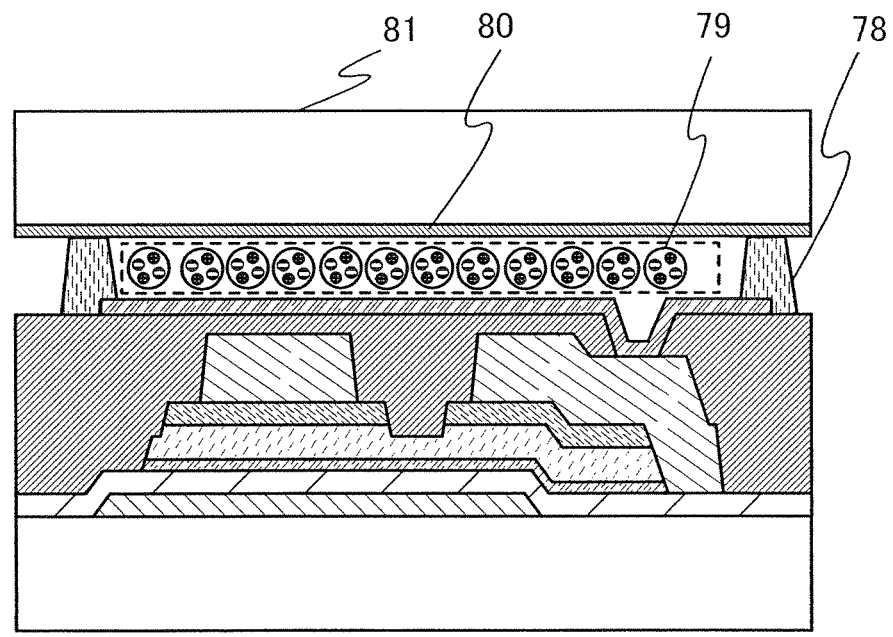

After that, as shown in FIG. 3B, a partition layer 78 is formed to cover a peripheral portion of the pixel electrode 77 and to cover an end portion of the pixel electrode 77. The partition layer 78 has a function to separate into every pixel in which a thin film transistor is formed. The insulator materials and formation method for the partition layer 78 may be similar to that of other insulator layers, and carbon black or colorant for blackening is preferably dispersed. Adjacent pixels are separated in this manner, so that cross talk can be prevented and a clear image can be obtained by adding a function as a black stripe as shown in a liquid crystal display device or the like. The partition layer 78 is provided so as to surround the end portion of the pixel electrode 77, so that an electric short circuit can be reduced, which occurs between the pixel electrode and the counter electrode when the electrophoretic display device is used in a bending manner. The area of an opening may be decided as appropriate. The opening is acceptable as long as the opening has an area in which an image can be recognized when fine particles included in the electrophoretic display device move or rotate over each pixel electrode, for example 100 μm×400 μm.

Note that description of the electrophoretic display element described in this embodiment mode is made as it is the electrophoretic display element of a microcapsule method by which an image is displayed by the electrophoretic materials with which a microcapsule is filled. Note that the present invention may be the electrophoretic display element which can be applied to an electrophoretic display device, and a display element of vertical electrophoretic method or horizontal electrophoretic method may also be used.

The electrophoretic material with which a microcapsule is filled is described with reference to FIG. 4. An electrophoretic display element of a microcapsule method is an element which displays using light-transmitting liquid in a microcapsule 406 having a diameter of approximately 80 μm, a white fine particle 401 which is positively-charged, and a black fine particle 402 which is negatively-charged. When electric field is applied by electrodes interposing the microcapsule 406, the white fine particle 401 and the black fine particle 402 move to opposite directions. As shown in FIG. 4, when positive or negative electric field is applied between a counter electrode 403, and a pixel electrode 404 and a pixel electrode 405, the white or black fine particle is appeared on the surface. The white fine particle 401 has high reflectivity than that of the black fine particle 402, and reflection amount of external light is adjusted, whereby white or black color can be displayed.

As shown in FIG. 3B, as for the electrophoretic display element 79, a layer including the electrophoretic display element 79 is formed over the pixel electrode 77 surrounded by the partition layer 78 by a roll coater method, a printing method, a spray method, or the like. Then, a second flexible substrate 81 provided with a counter electrode 80 using a light-transmitting conductive film is adhered over the layer including the electrophoretic display element 79 using a top surface of the partition layer. Note that an adhesive material or the like may be provided in advance over the top surface or the like of the partition layer 78 in order to increase strength of adhesion between the partition layer 78 and the pixel electrode. Further, if necessary, a spacer (such as a bead spacer, a column spacer, or a fiber) may be further used to control the thickness of the layer including the electrophoretic display element 79. In the electrophoretic display device of the present invention, the potential of the counter electrode 80 is constant, and positive or negative voltage is applied by switching operation of the thin film transistor which connects to the pixel electrode 77, so that an image display can be realized in such a manner that the microcapsule of the electrophoretic display element 79 responds to the voltage application, and colored particles which are charged negatively or positively are gathered on one side. Moreover, a color image display can be also realized by providing a color filter between the counter electrode 80 and the second flexible substrate 81.

In the present invention, a thin film transistor manufactured using a microcrystalline semiconductor film is used as a switching element of a pixel. A microcrystalline semiconductor film has excellent electric characteristics such as mobility compared to that of an amorphous semiconductor film. Thus, the microcrystalline semiconductor film can be used as a thin film transistor included in a scan line side driver circuit which supplies a scan signal, in particular.

FIG. 5A is a longitudinal sectional view illustrating a structure of a pixel portion, and FIG. 5B is a top plan view. An inverted-staggered thin film transistor 503 which is interposed between a first flexible substrate 501 and a second flexible substrate 502, a pixel electrode 504 which is connected to thin film transistors, and an electrophoretic display element 506 in which charged particles included in a microcapsule is interposed between the pixel electrode 504 and a counter electrode 505 which is opposed to the pixel electrode 504 are provided. Note that details of the longitudinal sectional view illustrated in FIG. 5A is similar to the structure in manufacturing process described with reference to FIGS. 1A to 1C, FIGS. 2A to 2C, and FIGS. 3A and 3B. In addition, the longitudinal sectional view shown in FIG. 5A corresponds to I-J line of a top plan view shown in FIG. 5B.

The top plan view shown in FIG. 5B illustrates a pixel in an electrophoretic display device of the present invention. FIG. 5B illustrates positional relationships of a scan line 551, a signal line 552, a semiconductor layer 553, a drain electrode 554, a contact hole 555, a pixel electrode 556, a partition layer 557, or a capacitor line 558. In FIG. 5B, the scan line 551 functions as a gate electrode of a thin film transistor in a region which overlaps with the semiconductor layer 553. In addition, a region where the signal line 552 extended to the semiconductor layer 553 and overlaps with the semiconductor layer 553 functions as a source electrode. Further, the semiconductor layer corresponds to a layer in which the microcrystalline semiconductor film and a buffer layer overlap as described with reference to FIGS. 1A to 1C, FIGS. 2A to 2C, and FIGS. 3A and 3B. Note that the notations of the source and drain electrodes of a thin film transistor in description of FIG. 5B is not used for limiting that one functions as the source of a thin film transistor and the other functions as the drain of a thin film transistor, but for distinguishing these electrodes. Therefore, the side which is connected to the signal line 552 is referred to as a source electrode, and a side which is connected to the pixel electrode 556 is referred to as a drain electrode. In addition, the pixel electrode 556 is provided inside the partition layer 557 which is provided for separating each pixel. In other words, the partition layer 557 is provided over an end portion of the pixel electrode 556, and the pixel electrode 556 is provided so as to be surrounded by the partition layer 557. The capacitor line 558 is provided under the pixel electrode 556, and has a function for forming a capacitor which holds a signal input from the signal line 552.

Next, the appearance of a display panel of an electrophoretic display device of the present invention is described below.

FIG. 6A illustrates a mode of a display panel over which a signal line driver circuit 6013 is separately formed, and the signal line driver circuit 6013 is connected to a pixel portion 6012 formed over a substrate 6011. The pixel portion 6012 and a scan line driver circuit 6014 are each formed using a thin film transistor which uses a microcrystalline semiconductor film. By forming the signal line driver circuit with a thin film transistor by which higher mobility can be obtained compared to the thin film transistor including the microcrystalline semiconductor film, operation of the signal line driver circuit, which demands a higher driving frequency than that of the scan line driver circuit, can be stabilized. Note that the signal line driver circuit 6013 may be formed using a transistor including a single crystalline semiconductor, a thin film transistor including a polycrystalline semiconductor, or a transistor including an SOI. The pixel portion 6012, the signal line driver circuit 6013, and the scan line driver circuit 6014 are each supplied with potential of a power source, various signals, and the like via an FPC 6015.

Note that the signal driver circuit and the scan line driver circuit may both be formed over the same substrate provided with the pixel portion.

When the driver circuit is separately formed, a substrate provided with the driver circuit is not always required to be attached to a substrate provided with the pixel portion, and may be attached to, for example, the FPC. FIG. 6B illustrates a mode of a liquid crystal display device panel in which a signal line driver circuit 6023 is formed separately and is connected to a pixel portion 6022 and a scan line driver circuit 6024 that are formed over a substrate 6021. The pixel portion 6022 and the scan line driver circuit 6024 are each formed with a thin film transistor which uses a microcrystalline semiconductor film. The signal line driver circuit 6023 is connected to the pixel portion 6022 via an FPC 6025. The pixel portion 6022, the signal line driver circuit 6023, and the scan line driver circuit 6024 are each supplied with potential of a power source, various signals, and the like via the FPC 6025.

Part of the signal line driver circuit or part of the scan line driver circuit may be formed over the same substrate provided with the pixel portion using the thin film transistor which uses a microcrystalline semiconductor film, and the rest may be formed separately and electrically connected to the pixel portion. FIG. 6C illustrates a mode of a liquid display device panel in which an analog switch 6033a included in a signal line driver circuit is formed over a substrate 6031, which is the same substrate as a pixel portion 6032 and a scan line driver circuit 6034, and a shift register 6033b included in the signal line driver circuit is separately formed over a different substrate and attached to the substrate 6031. The pixel portion 6032 and the scan line driver circuit 6034 are each formed using the thin film transistor which uses a microcrystalline semiconductor film. The shift register 6033b included in the signal line driver circuit is connected to the pixel portion 6032 via an FPC 6035. The pixel portion 6032, the signal line driver circuit, and the scan line driver circuit 6034 are each supplied with potential of a power source, various signals, and the like via the FPC 6035.

As illustrated in FIGS. 6A to 6C, in the electrophoretic display device of the present invention, part of a driver circuit or the entire driver circuit can be formed over the same substrate as a pixel portion, using the thin film transistor which uses a microcrystalline semiconductor film.

Note that there are no particular limitations on a connection method of a separately formed substrate, and a known method such as a COG method, a wire bonding method, or a TAB method can be used. Further, a connection position is not limited to the positions shown in FIGS. 6A to 6C as long as electrical connection is possible. A controller, a CPU, a memory, or the like may be formed separately and connected.

Note that a signal line driver circuit used in the present invention is not limited to a mode including only a shift register and an analog switch. In addition to the shift register and the analog switch, another circuit such as a buffer, a level shifter, or a source follower may be included. The shift register and the analog switch are not always required to be provided, and for example a different circuit such as a decoder circuit by which selection of signal line is possible may be used instead of the shift register, and a latch or the like may be used instead of the analog switch.

As described above, an electrophoretic display device including a channel-etch thin film transistor having a microcrystalline semiconductor film can be formed. This channel-etch thin film transistor requires the smaller number of manufacturing process and can achieve cost reduction. By formation of a channel formation region with a microcrystalline semiconductor film, a field-effect mobility of 1 to 20 cm$^2$/V·sec can be achieved. Thus, this thin film transistor can be used as a switching element of a pixel in a pixel portion and as an element included in a driver circuit of scan line (gate line) side.

In accordance with this embodiment mode, an electrophoretic display device including a highly reliable thin film transistor with excellent electric characteristics can be manufactured.

(Embodiment Mode 2)

In this embodiment mode, a manufacturing process, which is a different process of the electrophoretic display device shown in Embodiment Mode 1, is described with reference to FIGS. 7A to 7B and FIGS. 8A and 8B.

First, a molybdenum film 702 is formed over a supporting substrate 701. As the supporting substrate 701, a glass substrate, a ceramics substrate, or a quartz substrate can be used. In this embodiment mode, a glass substrate is used. The molybdenum film 702 is a molybdenum film formed by a sputtering method with a thickness of 30 to 200 nm. Since the substrate may be fixed in the sputtering method, the thickness of the molybdenum film in the vicinity of the edge portion of the substrate tends to be nonuniform. Therefore, the molybdenum film on the edge portion is preferably removed by dry etching.

Next, a molybdenum oxide film 703 is formed by oxidation of a surface of the molybdenum film 702. The molybdenum oxide film 703 may be formed by oxidation of the surface with the use of pure water or ozone water or with the use of oxygen plasma. Alternatively, the molybdenum oxide film 703 may be formed by heating in an atmosphere including oxygen.

Figure 7A:
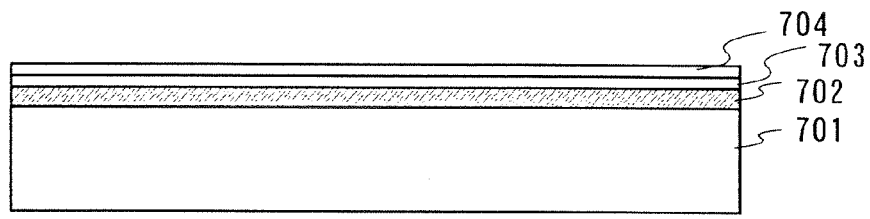
FIGS. 7A to 7C are cross-sectional views illustrating manufacturing process of an electrophoretic display device.

Then, an insulating layer 704 is formed over the molybdenum oxide film 703. The insulating layer 704 is an insulating film such as a silicon oxide film, a silicon nitride film, a silicon oxynitride film ($SiO_xN_y$), or the like. A typical example of the insulating layer 704 has a two-layer structure of a silicon nitride oxide film formed to have a thickness of 50 to 100 nm by a PCVD method using $SiH_4$, $NH_3$, and $N_2O$ as reactive gases and a silicon oxynitride film formed to have a thickness of 100 to 150 nm using $SiH_4$ and $N_2O$ as reactive gases. FIG. 7A shows a cross-sectional process view at a stage where the processes up to here are completed. Note that stacked layers of the molybdenum film 702 and a molybdenum oxide film are referred to as a separation layer in this specification.

Subsequently, an inverted-staggered thin film transistor 705 is formed over the insulating layer 704 as described in Embodiment Mode 1. Specifically, a gate electrode, a gate insulating film, a microcrystalline semiconductor film, a buffer layer, source and drain regions, and source and drain electrodes are sequentially stacked as described in Embodiment Mode 1.

Figure 7B:
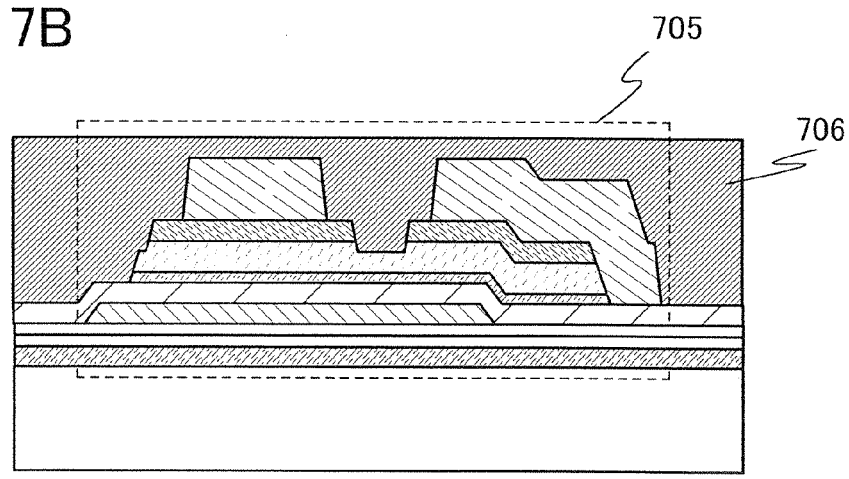

Subsequently, an interlayer insulating layer 706 is formed over the thin film transistor 705. For the interlayer insulating layer 706, for example, an organic insulator material which is an organic solvent with acrylic resin, polyimide resin, polyamide resin, phenoxy resin, nonaromatic multifunctional isocyanate, melamine resin, or the like added are employed, and after it is dried, the interlayer insulating layer 706 is cured at the temperature of 100 to 200° C. to have a thickness of 1 to 5 μm. Further, the material of the interlayer insulating layer 706 is not necessarily limited to the organic insulator material, and a silicon oxide film formed by an application method may be used. A silicon oxide film, a silicon nitride film, a silicon oxynitride film, or a silicon nitride oxide film can be formed by a CVD method, a sputtering method, or the like in a range of temperature that the flexible substrate can withstand (200 to 300° C.). Note that when unevenness is formed over the surface of the interlayer insulating layer 706, it is preferable to perform planarization for the surface because the surface for excellent coverage can be obtained in forming a pixel electrode on the surface. Note that as the planarization treatment, an etched back method in which etching for planarization is performed after the insulating film is formed, mechanical chemical polishing (CMP method), or the like can be used. Note that the thin film transistor 705 and interlayer insulating layer 706 in this embodiment mode can be formed using a supporting substrate such as a glass substrate. Therefore, unlike Embodiment Mode 1, film formation at the high temperature is possible, which is limited when a flexible substrate having lower upper temperature limit compared to that of the glass substrate is used. FIG. 7B shows a cross-sectional process view at a stage where the processes up to here are completed.

Subsequently, the interlayer insulating layer 706 is removed selectively by patterning using a known photolithography technique to form a contact hole reaching the source or drain electrode. Then, in the contact hole, a pixel electrode 707 in contact with the source or drain electrode is formed.

Next, a partition layer 708 is formed to cover a peripheral portion of the pixel electrode 707 and to cover an end portion of the pixel electrode 707. The partition layer 708 has a function to separate into every pixel in which a thin film transistor is formed. The insulator materials and formation method for the partition layer 708 may be similar to that of other insulator layers. However, carbon black or colorant for blackening is preferably dispersed. Adjacent pixels are separated in this manner, so that cross talk can be prevented and a clear image can be obtained by adding a function as a black stripe as shown in a liquid crystal display device or the like. The partition layer 708 is provided so as to surround the end portion of the pixel electrode 707, so that an electric short circuit, which occurs between the pixel electrode and counter electrode when the electrophoretic display device is used in a bending manner, can be reduced. The area of the opening may be decided as appropriate. The opening is acceptable as long as the opening has an area in which an image can be recognized when fine particles included in the electrophoretic display device move or rotate over the pixel electrode of each pixel, for example 100 μm×400 μm.

Note that description of the electrophoretic display element described in this embodiment mode is made as it is the electrophoretic display element of a microcapsule method by which an image is displayed by the electrophoretic materials with which a microcapsule is filled. Note that the present invention may be the electrophoretic display element which can be applied to an electrophoretic display device, and a display element of vertical electrophoretic method or horizontal electrophoretic method may also be used.

Figure 7C:
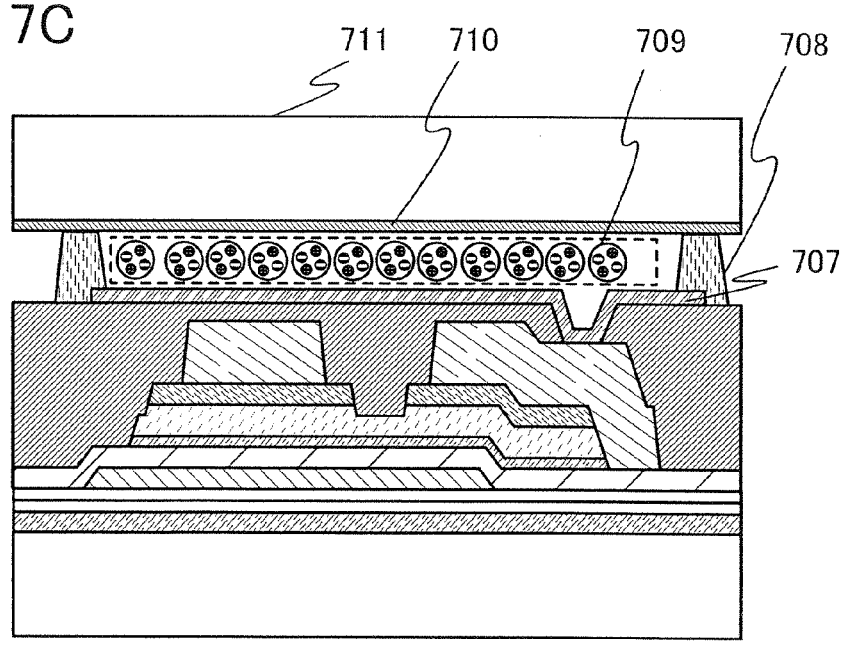

Next, as for an electrophoretic display element 709, a layer including the electrophoretic display element 709 is formed over the pixel electrode 707 surrounded by the partition layer 708 by a roll coater method, a printing method, a spray method, or the like. Then, a first flexible substrate 711 provided with a counter electrode 710 using a light-transmitting conductive film is adhered over the layer including the electrophoretic display element 709. Note that an adhesive material or the like may be provided in advance over the top surface or the like of the partition layer 708 in order to increase strength of adhesion between the partition layer 708 and the pixel electrode. Further, if necessary, a spacer (such as a bead spacer, a column spacer, or a fiber) may be further used to control the thickness of the layer including the electrophoretic display element 709. FIG. 7C shows a cross-sectional process view at a stage where the processes up to here are completed. In the electrophoretic display device of the present invention, the potential of the counter electrode 710 is constant, and positive or negative voltage is applied by switching operation of the thin film transistor which connects to the pixel electrode 707, so that an image display can be realized in such a manner that the microcapsule of the electrophoretic display element 709 responds to the voltage application, and colored particles which are charged negatively or positively are gathered on one side.

Figure 8A:
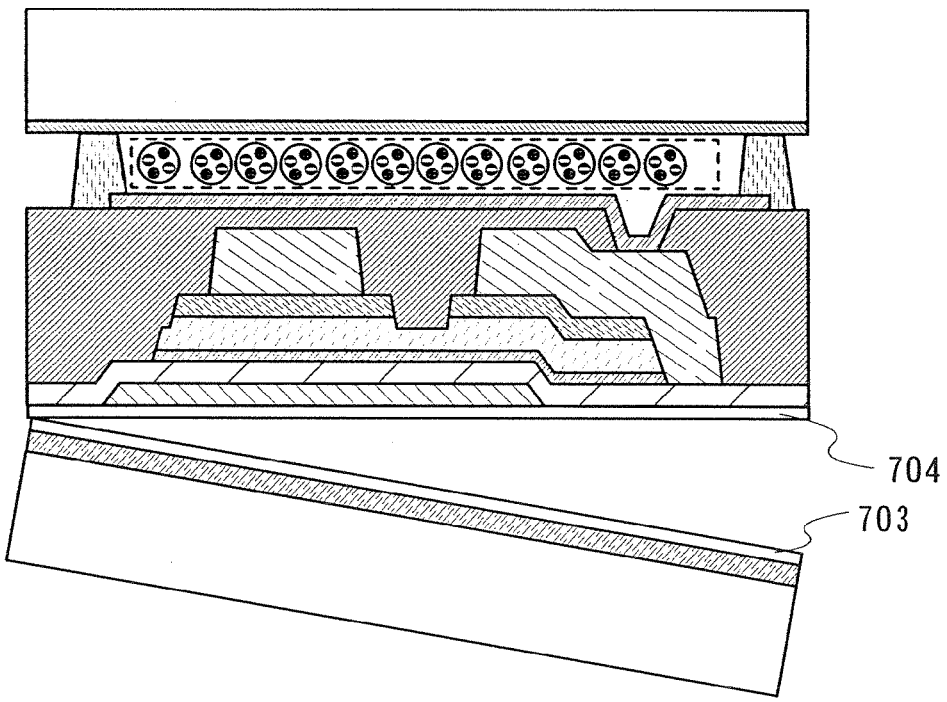
FIGS. 8A and 8B are cross-sectional views illustrating manufacturing process of an electrophoretic display device.

Subsequently, the thin film transistor 705, the interlayer insulating layer 706, the pixel electrode 707, the partition layer 708, the electrophoretic display element 709, the counter electrode 710, and the first flexible substrate 711 are separated from the molybdenum film 702, the molybdenum oxide film 703, and the supporting substrate 701. FIG. 8A is a view illustrating that separation occurs at the interface between the molybdenum oxide film 703 and the insulating layer 704.

Since the molybdenum film is fragile, separation can be performed with weaker forces compared to other metals. Although FIG. 8A illustrates a view in which separation is performed at the interface of the molybdenum oxide film 703 and the insulating layer 704, the position where separation is performed is not limited particularly as long as it is between the insulating layer 704 and the supporting substrate 701 in which a thin film transistor is not damaged. Separation may be performed in the molybdenum film or in the molybdenum oxide film, or at the interface between the supporting substrate and the molybdenum film or at the interface between the thin film transistor and the insulating layer.

Note that the separation layer is formed using not only a stacked layers of a molybdenum or a molybdenum oxide film but also a single layer of or stacked layers of a plurality of layers of an element selected from tungsten, titanium, tantalum, niobium, nickel, cobalt, zirconium, zinc, ruthenium, rhodium, palladium, osmium, iridium, or silicon, an alloy material containing any of the elements as it main component, or a compound material containing any of the elements as its main component. Note that as the transporting process from the supporting substrate, by a method for changing some dynamical (mechanical) energy which refers the physical method, that is a dynamical method or a mechanical method, application of a mechanical force (for example, a separation process with a human hand or with a gripper, or a separation process by rotation of a roller) may be performed. At this time, separation can be performed more easily if an adhesive sheet that can be separated by light or heat is provided on the surface of the first flexible substrate over the supporting substrate.

Figure 8B:
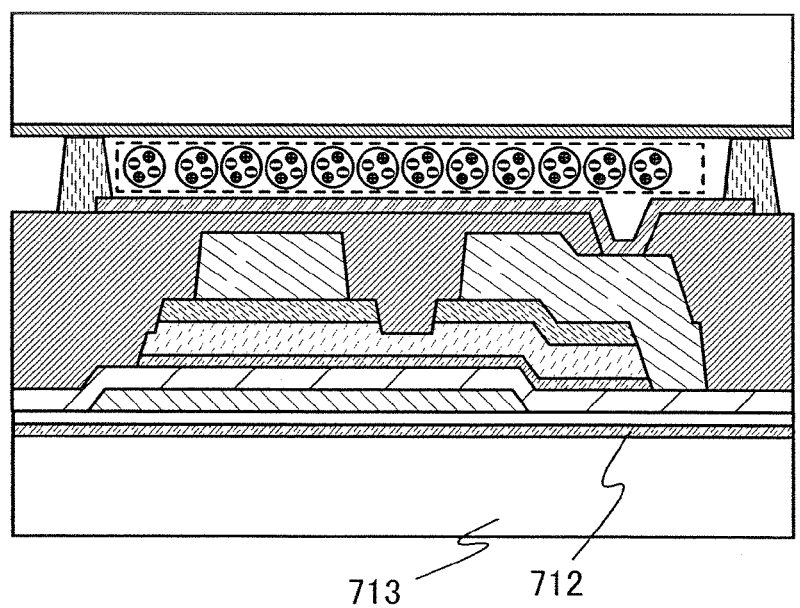

Subsequently, as shown in FIG. 8B, the second flexible substrate 713 is fixed using an adhesive layer 712 to the side on which the separation has been caused, in order to increase mechanical strength of an electrophoretic display device. Note that the second flexible substrate 713 and the first flexible substrate 711 are preferably formed using materials having the same thermal expansion coefficient in order to maintain a constant substrate interval independently of temperature change. An element over the supporting substrate can be transposed to the second flexible substrate 713 through the above-mentioned processes. Note that to "transport" means that an element (including an element on the way to formation) which is formed over the substrate is moved to another substrate.

An electrophoretic display device can be manufactured using the thin film transistor including a microcrystalline semiconductor film in the above-mentioned processes. In the case of using the separation method described in this embodiment mode which uses a molybdenum film, adhesion of the electrophoretic display element is weak, which is adhered in such a manner that the partition layer surrounding the pixel electrode is bonded to a counter electrode. However, in the case of using the separation method of this embodiment mode using the molybdenum film, separation can be performed in the vicinity of the molybdenum film (in this embodiment mode, the interface of the molybdenum oxide film 703 and the insulating layer 704).

This embodiment mode can be implemented in combination with the structures described other embodiment modes.

(Embodiment Mode 3)

Figure 9A:
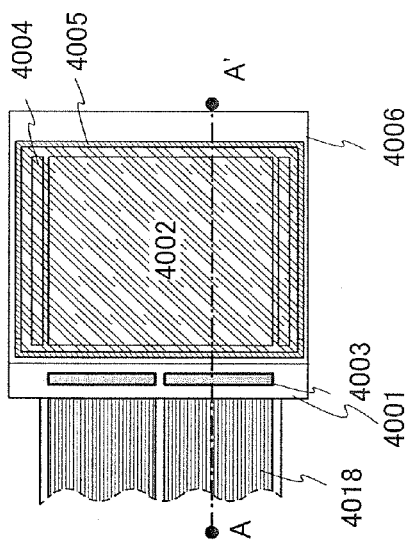
FIGS. 9A and 9B are a top view and a cross-sectional view of an electrophoretic display device.
Figure 9B:
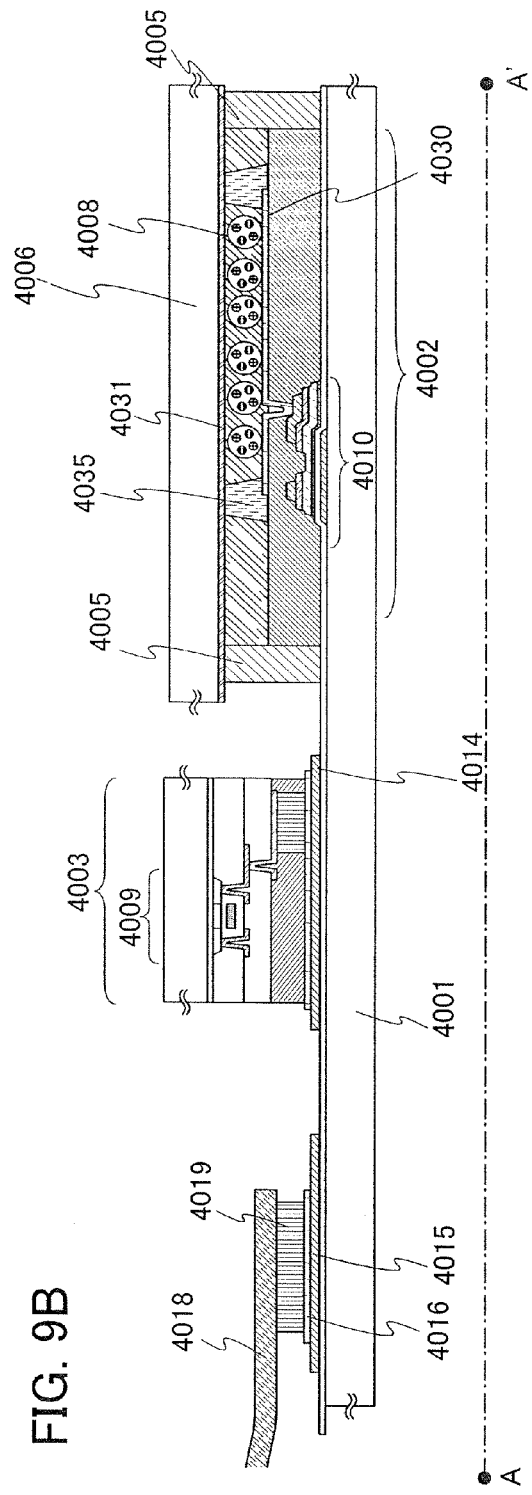

In this embodiment, the appearance and the cross section of an electrophoretic display device of the present invention is described with reference to FIGS. 9A and 9B. FIGS. 9A and 9B are views of an electrophoretic display device in which a thin film transistor 4010 including a microcrystalline semiconductor film and an electrophoretic display element 4008 which are formed over a first flexible substrate 4001 are sealed with a sealant 4005 between the first substrate 4001 and a second flexible substrate 4006. FIG. 9B is a cross-sectional view taken along line A-A' of FIG. 9A.

A sealant 4005 is provided so as to surround a pixel portion 4002 and a scan line driver circuit 4004 which are provided over the first flexible substrate 4001. Further, the second flexible substrate 4006 is provided over the pixel portion 4002 and the scan line driver circuit 4004. Therefore, the pixel portion 4002 and the scan line driver circuit 4004 as well as the electrophoretic display element 4008 are sealed by the first flexible substrate 4001, the sealant 4005, and the second flexible substrate 4006. Further, a signal line driver circuit 4003 which is formed using a polycrystalline semiconductor film over a different substrate is mounted on a region over the first flexible substrate 4001, which is different from the region surrounded by the sealant 4005. Note that in this embodiment mode, an example is described in which the signal line driver circuit including a thin film transistor using a polycrystalline semiconductor film is attached to the first flexible substrate 4001; however, the signal line driver circuit may be formed using a transistor using a single crystal semiconductor and attached to a substrate. FIGS. 9A and 9B exemplify a thin film transistor 4009 formed using a polycrystalline semiconductor film, which is included in the signal line driver circuit 4003.

Each of the pixel portion 4002 and the scan line driver circuit 4004 which are provided over the first flexible substrate 4001 include a plurality of thin film transistors in matrix. FIG. 9B illustrates the thin film transistor 4010 included in the pixel portion 4002. The thin film transistor 4010 corresponds to a thin film transistor using a microcrystalline semiconductor film.

The pixel electrode 4030 is electrically connected to the thin film transistor 4010. Then, a counter electrode 4031 is formed over the second flexible substrate 4006.

Note that as the first flexible substrate 4001 and the second flexible substrate 4006, polyethylene terephthalate (PET), polyethylene naphthalate (PEN), polyethersulfone (PES), polycarbonate (PC), polyimide, or the like can be used. Note that it is preferable that a barrier layer be formed of an inorganic insulating material with a thickness of 10 to 200 nm over the surface of the first flexible substrate 4001 and the second flexible substrate 4006. Note that the second flexible substrate corresponds to a counter substrate for interposing an electrophoretic display element with the first flexible substrate 4001 and has at least light transmitting property. As a barrier layer, $AlO_xN_{1-x}$ (note that x=0.01 to 20 at. %), or a single layer or a stacked structure using a plurality of layers formed of silicon nitride which does not include hydrogen, and which is formed by a high frequency sputtering method using silicon as a target and using nitrogen as sputtering gas, is employed. The inorganic insulating material is formed to be dense so as to be a barrier layer for steam and an organic gas entering from the external environment. An object for forming the barrier layer is to prevent deterioration of an electrophoretic display element by steam and the organic gas.

Reference numeral 4035 denotes a partition layer which is provided over an end portion of the pixel electrode 4030 so as to surround the pixel electrode 4030. The partition layer 4035 is provided to increase strength of adherence on the first flexible substrate 4001 side and the second flexible substrate 4006 side as well as to control a distance between the partition layer 4035 and the counter electrode 4031 (a cell gap).

Various signals and potentials are supplied to the signal line driver circuit 4003 which is formed separately, the scan line driver circuit 4004, and the pixel portion 4002 via leading wirings 4014 and 4015 from an FPC 4018.

In this embodiment mode, a connecting terminal 4016 is formed of the same conductive film as the pixel electrode 4030 included in the pixel portion 4002. Further, the leading wirings 4014 and 4015 are formed with a conductive film which is the same as a gate electrode of the thin film transistor 4010.

The connecting terminal 4016 is electrically connected to a terminal of an FPC 4018 through an anisotropic conductive film 4019.

Although not illustrated, the electrophoretic display device shown in this embodiment mode includes an alignment film, and a polarizing plate, and further, may include a color filter and a light-blocking film.

FIGS. 9A and 9B illustrate an example in which the signal line driver circuit 4003 is formed separately and mounted on the first flexible substrate 4001; however, this embodiment mode is not limited to this structure. The scan line driver circuit may be separately formed and then mounted, or only part of the signal line driver circuit or part of the scan line driver circuit may be separately formed and then mounted.

This embodiment mode can be implemented in combination with the structures described other embodiment modes.

[Embodiment 1]

The present invention can be implemented in electronic devices or structures of which a display portion is formed by the electrophoretic display device obtained by the present invention. The applications are described below.

As such a structure, an exterior wall, a window, or a columnar structure body such as a utility pole is given as an example. In addition, as those kinds of electronic devices, video cameras and digital cameras; head-mounted display (goggle-type displays); car navigation systems; projectors; car stereos; personal computers; portable information terminals (such as mobile computers, cellular phones, or electronic book readers); and the like can be given. Specific examples of them are shown in FIGS. 10A to 10C.

Figure 10A:
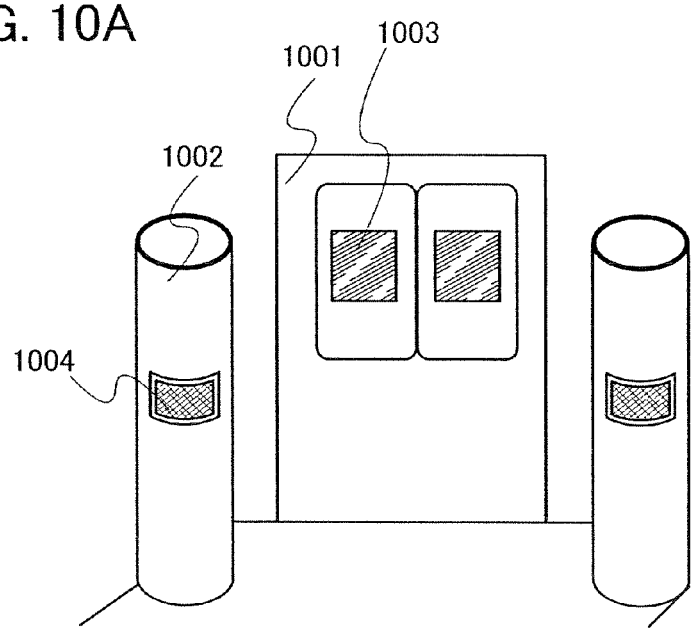
FIGS. 10A to 10C are views illustrating an application of an electrophoretic display device.

FIG. 10A illustrates a window 1001 provided on the exterior wall and a columnar structure body 1002 like a utility pole or the like. In FIG. 10A, the window 1001 is provided with a piece of electronic paper 1003. As for the columnar structure body 1002, a piece of electronic paper 1004 is attached to a curved surface on the side of the column structure body. The electrophoretic display device of the present invention can be manufactured using a flexible substrate which is lightweight as described in above-mentioned embodiment modes, and can be used as the electronic paper as shown in FIG. 10A. Therefore, the electrophoretic display device of the present invention can be attached to not only a structure having a flat surface like the window 1001 but also a structure having a curved surface like the columnar structure body 1002. In addition, the electrophoretic display device of the present invention has high electric characteristics, and can be manufactured using a highly reliable thin film transistor. Note that when an image is displayed with the electronic paper being attached to a structure, it is preferred that an image signal and power are supplied by a radio signal because convenience for setting the electronic paper increases.

Figure 10B:
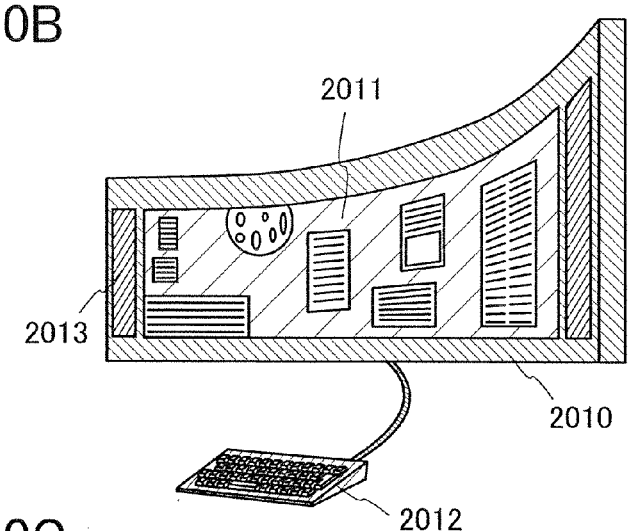
Figure 10C:
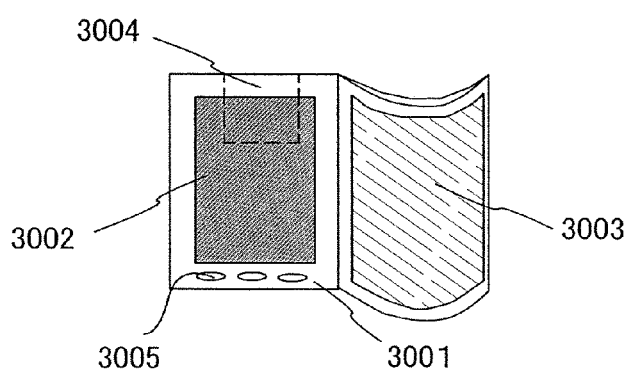

FIG. 10B illustrates a television device which has a large display portion, for example, 20 to 80 inch of a large display portion and includes a housing 2010, a keyboard portion 2012 which is an operation portion, a display portion 2011, a speaker portion 2013, and the like. The electrophoretic display device of the present invention is applied to manufacturing of the display portion 2011. A flexible substrate which can be curved can be used for the electrophoretic display device shown in FIG 10B; thus, a television device of which a display portion is curved can be obtained. Since the shape of the display portion can be designed freely in such a manner, a television device with a desired shape can be manufactured. In addition, a television device manufactured with the electrophoretic display device of the present invention has high electric characteristics, and can be manufactured using a highly reliable thin film transistor.

It is needless to say that the invention is not limited to the television device and can be used as a large area display medium for various applications such as a monitor of a personal computer, an information display at a train station, airport, and the like, an advertisement display on the streets, and the like.

In addition, FIG. 10C is a portable information terminal (electronic book reader) and includes a main body 3001, display portions 3002 and 3003, a storage medium 3004, operation switches 3005, and the like. The electrophoretic display device of the present invention is applied to the manufacture of the display portion 3002. A flexible substrate which can be curved for the electrophoretic display device shown in FIG. 10C is employed; thus, a portable information terminal of which a display portion is curved can be obtained. Since the shape of the display portion can be designed freely in such a manner, a portable information terminal with a desired shape can be manufactured. In addition, a portable information terminal manufactured with the electrophoretic display device of the present invention has high electric characteristics, and can be manufactured using a highly reliable thin film transistor. The separation method of the present invention can be applied to the display portions 3002 and 3003. The weight of the portable information terminal can be reduced by using a flexible substrate.

This embodiment can be freely combined with any one of Embodiment Modes 1 to 3.

This application is based on Japanese Patent Application serial no. 2007-246100 filed with Japan Patent Office on Sep. 21, 2007, the entire contents of which are hereby incorporated by reference.

What is claimed is:

1. An electrophoretic display device comprising:
   a gate electrode over a first flexible substrate;
   a gate insulating film over the gate electrode;
   a microcrystalline semiconductor film over the gate insulating film;
   an amorphous semiconductor film over the microcrystalline semiconductor film;
   source and drain regions over the amorphous semiconductor film;
   source and drain electrodes over the source and drain regions;
   an interlayer insulating film over the source and drain electrodes;
   a pixel electrode over the interlayer insulating film, the pixel electrode electrically connected with one of the source and drain electrodes;
   an electrophoretic display element over the pixel electrode;
   a counter electrode over the electrophoretic display element;
   a partition layer being in contact with the interlayer insulating film and the counter electrode; and
   a second flexible substrate over the counter electrode,
   wherein the electrophoretic display element is surrounded by the partition layer which is provided so as to cover an end portion of the pixel electrode,
   wherein an upper surface of the amorphous semiconductor film has a depression portion,
   wherein a first end portion of the gate electrode extends beyond a first end portion of the microcrystalline semiconductor film, and
   wherein a second end portion of the microcrystalline semiconductor film extends beyond a second end portion of the gate electrode.

2. The electrophoretic display device according to claim 1, wherein only one of the source and drain electrode covers end portions of the source and drain regions, the amorphous semiconductor film, and the microcrystalline semiconductor film.

3. The electrophoretic display device according to claim 1, wherein the amorphous semiconductor film contains nitrogen.

4. The electrophoretic display device according to claim 1, wherein the amorphous semiconductor film contains hydrogen.

5. The electrophoretic display device according to claim 1, wherein the amorphous semiconductor film contains any one of fluorine, chlorine, bromine, and iodine.

6. The electrophoretic display device according to claim 1,
   wherein first portions of top surfaces of the source and drain regions are in contact with the source and drain electrodes, and
   wherein second portions of the top surfaces of the source and drain regions are not in contact with the source and drain electrodes.

7. The electrophoretic display device according to claim 1, wherein the end portions of the source and drain regions which are formed over the gate electrode are aligned with side faces of the depression portion of the amorphous semiconductor film.

8. An electrophoretic display device comprising:
   a gate electrode over a first flexible substrate;
   a gate insulating film over the gate electrode;
   a microcrystalline semiconductor film over the gate insulating film;
   an amorphous semiconductor film over the microcrystalline semiconductor film;
   source and drain regions over the amorphous semiconductor film;
   source and drain electrodes over the source and drain regions;
   an interlayer insulating film over the source and drain electrodes;
   a pixel electrode over the interlayer insulating film, the pixel electrode electrically connected with one of the source and drain electrodes;
   an electrophoretic display element over the pixel electrode;

a counter electrode over the electrophoretic display element;

a partition layer being in contact with the interlayer insulating film and the counter electrode; and a second flexible substrate over the counter electrode, wherein the electrophoretic display element is surrounded by the partition layer which is provided so as to cover an end portion of the pixel electrode, wherein one of the source and drain electrodes covers end portions of the source and drain regions, the amorphous semiconductor film, and the microcrystalline semiconductor film, and the other of the source and drain electrodes does not extend over other end portions of the source and drain regions, the amorphous semiconductor film, and the microcrystalline semiconductor film, wherein an upper surface of the amorphous semiconductor film has a depression portion, wherein a first end portion of the gate electrode extends beyond a first end portion of the microcrystalline semiconductor film, and wherein a second end portion of the microcrystalline semiconductor film extends beyond a second end portion of the gate electrode.

9. The electrophoretic display device according to claim 8, wherein the amorphous semiconductor film contains nitrogen.

10. The electrophoretic display device according to claim 8, wherein the amorphous semiconductor film contains hydrogen.

11. The electrophoretic display device according to claim 8, wherein the amorphous semiconductor film contains fluorine, chlorine, bromine, or iodine.

12. The electrophoretic display device according to claim 8, wherein the end portions of the source and drain regions which are formed over the gate electrode are aligned with side faces of the depression portion of the amorphous semiconductor film.

13. The electrophoretic display device according to claim 8, wherein the end portions of the source and drain electrodes near the depression portion of the amorphous semiconductor film are not aligned with end portions of the source and drain regions adjacent to the depression portion of the amorphous semiconductor film.

* * * * *